(12) United States Patent
Chen et al.

(10) Patent No.: US 7,167,528 B2
(45) Date of Patent: Jan. 23, 2007

(54) MODULATION SYSTEM FOR MODULATING DATA ONTO A CARRIER SIGNAL WITH OFFSETS TO COMPENSATE FOR DOPPLER EFFECT AND ALLOW A FREQUENCY SYNTHESIZING SYSTEM TO MAKE STEPS EQUAL TO CHANNEL BANDWIDTH

(75) Inventors: Keming Joseph Chen, San Diego, CA (US); Mark Steven Schmidt, San Diego, CA (US)

(73) Assignee: General Instrument Corporation, Horsham, PA (US)

( * ) Notice: Subject to any disclaimer, the term of this patent is extended or adjusted under 35 U.S.C. 154(b) by 664 days.

(21) Appl. No.: 10/167,845

(22) Filed: Jun. 11, 2002

(65) Prior Publication Data

US 2003/0227982 A1 Dec. 11, 2003

(51) Int. Cl.
*H03C 3/00* (2006.01)

(52) U.S. Cl. ...................................... 375/302; 375/271

(58) Field of Classification Search ................ 375/260, 375/271, 275, 278, 296, 295, 302, 306; 455/114.2, 455/110, 113; 332/117, 103
See application file for complete search history.

(56) References Cited

U.S. PATENT DOCUMENTS

| 5,390,346 A | | 2/1995 | Marz | |
|---|---|---|---|---|
| 5,412,352 A | * | 5/1995 | Graham | ........................ 332/103 |
| 5,446,423 A | * | 8/1995 | Bienz et al. | ................. 332/170 |
| 5,717,719 A | | 2/1998 | Park et al. | |
| 5,732,333 A | * | 3/1998 | Cox et al. | .................... 455/126 |
| 5,886,752 A | * | 3/1999 | Cross | .......................... 348/724 |
| 6,141,390 A | | 10/2000 | Cova | |
| 6,236,283 B1 | * | 5/2001 | Koslov | ........................ 332/103 |
| 6,259,747 B1 | * | 7/2001 | Gustafsson et al. | ......... 375/298 |
| 6,268,818 B1 | | 7/2001 | Xin et al. | |
| 6,611,568 B2 | * | 8/2003 | Hawley et al. | ............. 375/308 |
| 6,766,154 B2 | * | 7/2004 | Humes et al. | .............. 455/260 |

FOREIGN PATENT DOCUMENTS

EP 0817369 A2 1/1998
EP 0853387 A2 7/1998

* cited by examiner

*Primary Examiner*—Khanh Tran
(74) *Attorney, Agent, or Firm*—Larry T. Cullen

(57) ABSTRACT

A method and system for modulating data onto a carrier signal in a plurality of channels, each of the channels having a channel bandwidth, can be created for use in any two-way satellite communication system or other wireless communication application where frequency hopping with or without Doppler compensation is desired. The system preferably includes a digital modulator that outputs a modulated baseband signal, an intermediate frequency modulator that receives the modulated baseband signal and outputs an intermediate frequency signal derived from the modulated baseband signal, a frequency synthesizing system that outputs a synthesized intermediate frequency signal to the intermediate frequency modulator, and a circuit (numerically controlled oscillator) connected to the digital modulator which provides a signal to the digital modulator. This signal has a frequency including an offset that allows the frequency synthesizing system and intermediate frequency modulator to make frequency steps equal to the channel bandwidth. The offset can also include a small offset that compensates for the Doppler effect.

29 Claims, 5 Drawing Sheets

MODULATION SYSTEM FOR MODULATING DATA ONTO A CARRIER SIGNAL WITH OFFSETS TO COMPENSATE FOR DOPPLER EFFECT AND ALLOW A FREQUENCY SYNTHESIZING SYSTEM TO MAKE STEPS EQUAL TO CHANNEL BANDWIDTH

FIELD OF THE INVENTION

The present invention relates to the field of signal modulation. More particularly, the present invention relates to the field of two-way satellite communication systems in which modulated signals carry data.

BACKGROUND OF THE INVENTION

The $K_a$-band of the electromagnetic spectrum is the radio frequency band between about 17 and 36 GHz. This upper portion of the microwave range is used primarily for satellite communication. Many two-way satellite communication systems transmit and receive data in the $K_a$-band. However, other two-way satellite communication systems transmit and receive data in various other bands such as the C-band (3.7–6.4 GHz) and the $K_u$-band (11–15 GHz), for example. Future systems may use higher frequencies (e.g., 60 GHz).

Modulation and upconversion are essential methods used in wireless communication systems, including two-way satellite communication systems. Upconversion is the translation of a signal's frequency from baseband, or the original frequency before modulation, to a higher frequency. The signal is then transmitted at this higher frequency. Upconversion is done because most antennas can only receive signals that have short wavelengths. Frequency is the inverse of wavelength. Therefore, the higher the frequency a signal has, the shorter its wavelength.

Modulation is a method used to transmit and receive digital signals. By varying the phase of the transmitted signal, for example, information can be conveyed. This type of modulation is called phase-shift keying (PSK). There are several schemes that can be used to accomplish PSK. The simplest method uses only two signal phases: 0 degrees and 180 degrees. The digital signal is broken up time wise into individual bits (binary digits—zeros and ones). The state of each bit is determined according to the state of the preceding bit. If the phase of the wave does not change, then the signal state stays the same (low or high). If the phase of the wave changes by 180 degrees—that is, if the phase reverses—then the signal state changes (from low to high, or from high to low). Because there are two possible wave phases, this form of PSK is sometimes called Binary Phase Shift Keying (BPSK).

A more complex form of PSK is called Quadrature Phase Shift Keying (QPSK). QPSK modulation employs four wave phases and allows binary data to be transmitted at a faster rate per phase change than is possible with BPSK modulation. In QPSK modulation, the signal to be transmitted is first separated into two signals: the In-phase (I) signal and the Quadrature (Q) signal. The I and Q signals are orthogonal, or 90 degrees out of phase. Thus, they are totally independent and do not interfere with each other. Each signal can then be phase shifted independently. Both the I and Q signals have two possible phase states. Combining the possible states for the I and Q signals results in four total possible states. Each state can then represent two bits. Thus, twice the information can be conveyed using QPSK modulation instead of BPSK modulation. For this reason, QPSK modulation is used in many two-way satellite communication systems.

For any two-way satellite communication system using a QPSK modulator and upconverter, there are a number of competing design goals. First, the system should have low phase noise. Phase noise is a result of rapid, short-term, random fluctuations in the phase of a wave and is caused by instabilities found in oscillators.

Low levels of spurious emissions (also called spurious noise) are also desirable. Spurious emissions are emissions on a frequency or frequencies which are outside the necessary bandwidth of the transmitting signal, but still within the band. These emissions may be reduced without affecting the corresponding transmission of information. Spurious emissions include intermodulation distortion and harmonic distortion. Intermodulation distortion is a result of emissions on the sum and difference frequencies of the fundamental frequencies of the transmitted signal. Harmonic distortion is a result of emissions on frequencies that are not present in the input signal. Both distortions are caused by nonlinearities in the devices used to modulate the signals.

Another design goal is that there should also be a large frequency hopping range. Frequency hopping is a modulation technique that involves the repeated switching of frequencies during transmission. Frequency synthesizers generate the frequencies that are to be hopped to. A small frequency settling time, or the time it takes for the frequency synthesizer to lock into the new frequency, is also desirable. In the case of an example $K_a$-band two-way satellite communication system, there are four 125 MHz bands over which the frequency synthesizer must operate. Each band is partitioned into a number of channels. In one example, a class A two-way satellite communication system is defined to have 175 channels per band. In another example, a class B two-way satellite communication system is defined to have 35 channels per band. The frequency synthesizer must preferably be able to hop to the center frequency of each channel within a few nanoseconds.

A very fine frequency accuracy and step size is preferably required to compensate for, or correct, the Doppler effect. The Doppler effect refers to the phenomenon of a signal's frequency being affected by the relative motion of the transmitter and receiver. When the signal source is approaching the observer, for example, the signal's frequency increases. Because satellites are constantly moving, the modulator and upconverter must preferably compensate for the Doppler effect. The Doppler frequency may range from −160 Hz to +160 Hz in two-way geostationary satellite communication.

Finally, there should be small amplitude and group delay variation across the hopping band. Amplitude variation happens when the signal has different amplitudes across the band. Group delay is the rate of change of the total phase shift with respect to angular frequency through a transmission medium. It is desirable to maintain both a constant amplitude and group delay across the hopping band.

Currently, the $K_a$-band upconversion entails a multi-stage conversion process. First, baseband QPSK I,Q streams are modulated and then upconverted to an Intermediate Frequency (IF) in the L-band range (e.g., 1.7–2.2 GHz). This conversion is performed by in an Indoor Unit (IDU). The signal is then upconverted again and amplified to 29.5 to 30.0 GHz in an Outdoor Unit (ODU) located at the terminal's antenna. The upconversion is then complete and the signal is ready for transmission. To meet frequency accuracy requirements, the Local Oscillators (LO's) in all the upconversion stages can be phase locked to a single reference (e.g., a reference locked to the stable satellite payload oscillator available in the satellite downlink signal).

The IDU and the ODU are connected via some type of cable, for example RG-6. This type of cable performs well and has relatively small losses (10–15 dB per 100 feet) at frequencies of 1.7–2.2 GHz. In addition, RG-6 cable is easy to procure because this IF range is a common range used currently with digital satellite television set-tops. Thus, there are many RG-6 suppliers. However, other kinds of cables could also possibly be used to connect the IDU and the ODU.

Because of the various competing design goals mentioned above, there are many tradeoffs that are made in the IDU modulator and IF upconverter design. For example, single analog upconversion from baseband to IF can achieve low spurious and phase noise, large hopping range, and small amplitude and delay variation. However, these gains are achieved at the expense of a large frequency settling time and large step sizes. Direct-Digital Synthesis (DDS) can be used in these analog synthesizers to improve settling time and decrease step size but can require costly filtering to achieve low spurious noise. Heterodyne architectures (e.g., double analog upconverters) can be used to reduce the spurious noise. However, such architectures require complex analog bandpass filtering that risks increasing amplitude and group delay variation.

An alternate approach to meet the design goals above is to use an all-digital upconverter to accomplish the upconversion from baseband to IF. This, however, forces the Digital-to-Analog Converter (DAC) to operate at a very high sampling rate (e.g., greater than 1.7–2.2 GHz). DACs that operate at these high sample rates are currently difficult to design and are not cost-effective for most applications.

Digital upconversion can be used in conjunction with analog IF upconversion to achieve fast hopping and small step size over a limited bandwidth. Digital process technologies (CMOS) enable current designs of Numerically Control Oscillators (NCOs) to economically run at 200–400 MHz clock frequencies to achieve frequency hopping bandwidths of 50–100 MHz. When combined with analog upconversion, however, there can be serious spurious emission problems. For example, a digital I/Q upconversion to a center frequency of $f_d$=10 MHz requiring analog upconversion to 1.7 GHz utilizes an analog LO of $f_{VCO,IF}$=1.71 GHz or 1.69 GHz. DAC and analog mixer nonlinearities and unbalances induce spurious noise (intermodulation distortion) at IF at frequencies of $\pm n f_{VCO,IF} \pm m f_d$ for integers m and n. It is difficult to sufficiently filter (reject) intermodulation products at multiples of 10 MHz from the desired carrier frequency.

Another problem with using digital upconversion in conjunction with analog IF upconversion has to do with the compensation of the Doppler effect. A prior solution included compensating for the Doppler effect in the analog IF upconversion stage by slightly varying $f_{VCO,IF}$. This is difficult and costly because Doppler compensation requires very fine frequency accuracy and very fine step size. Varying $f_{VCO,IF}$ also induces spurious noise at frequencies in adjacent channels. Adjacent Channel Emissions (ACE) specifications are stringent at large offsets from the desired carrier frequency and more lenient close to the signal bandwidth. Thus, the increased spurious noise in adjacent channels due to Doppler compensation in the analog IF upconversion stage results in additional necessary filtering that is difficult and expensive. Thus, in a combined digital/analog modulator and upconverter used in the IDU, there is a need in the art for a method and system that compensate for the Doppler effect while avoiding out of channel spurious noise and not requiring an analog IF frequency synthesizer with very fine frequency accuracy and very fine step size.

In between each of the four 125 MHz bands, there is a guard band. A guard band is a frequency band that is deliberately left vacant between two bands to provide a margin of safety against mutual interference. In many two-way satellite communication systems, the guard band's width is not a multiple of the channel widths. This poses a problem in the design of the analog IF frequency synthesizer. In tuning to a particular channel in one band and then hopping to a different channel in another band, the frequency synthesizer skips over the guard band. A traditional frequency synthesizer needs a small step size (e.g., 2.5 kHz) to accomplish this. This results in an undesirably high phase noise. Thus, in a digital combined with analog modulator and upconverter used in the IDU, there is a need in the art for a method and system that allow an analog IF frequency synthesizer to tune to different channels while skipping over the guard bands with a large enough step size that will maintain the phase noise within acceptable levels.

As used hereafter and in the appended claims, the term "two-way satellite communication systems" will be used to refer expansively to all possible two-way satellite communication systems and other wireless communication applications in any band where frequency hopping with or without Doppler compensation is desired.

SUMMARY OF THE INVENTION

In one of many possible embodiments, the present invention provides a modulation system for modulating data onto a carrier signal in a plurality of channels, each of the channels having a channel bandwidth. The system preferably includes a digital modulator that outputs a modulated baseband signal, an intermediate frequency modulator that receives the modulated baseband signal and outputs an intermediate frequency signal derived from the modulated baseband signal, a frequency synthesizing system that outputs a synthesized intermediate frequency signal to the intermediate frequency modulator, and a circuit connected to the digital modulator which provides a signal to the digital modulator. The signal has a frequency including an offset that allows the frequency synthesizing system and intermediate frequency modulator to make frequency steps equal to the channel bandwidth.

In another embodiment, the present invention provides a modulation system for modulating data onto a carrier signal in a plurality of channels, each of the channels having a channel bandwidth. The system preferably includes a digital modulator that outputs a modulated baseband signal, an intermediate frequency modulator that receives the modulated baseband signal and outputs an intermediate frequency signal derived from the modulated baseband signal, a frequency synthesizing system that outputs a synthesized intermediate frequency signal to the intermediate frequency modulator; and a circuit connected to the digital modulator which provides a signal to the digital modulator. The signal has a frequency including an offset that compensates for Doppler effect in transmission of the carrier signal.

In another embodiment, the present invention provides a method for modulating data onto a carrier signal in a plurality of channels, each of the channels having a channel bandwidth. The method preferably comprises providing a signal to a digital modulator that modulates a baseband signal. The signal has a frequency that includes an offset that allows a frequency synthesizing system and intermediate frequency modulator to make frequency steps equal to the channel bandwidth.

In another embodiment, the present invention provides a method of modulating data onto a carrier signal in a plurality of channels, each of the channels having a channel bandwidth. The method preferably comprises providing a signal to a digital modulator that modulates a baseband signal. The signal has a frequency that includes an offset that compensates for Doppler effect in transmission of the carrier signal.

Another embodiment of the present invention provides a system for modulating data onto a carrier signal in a plurality of channels, each of the channels having a channel bandwidth. The system comprises a digital modulator that outputs a modulated baseband signal, an intermediate frequency modulator that receives the modulated baseband signal and outputs an intermediate frequency signal derived from the modulated baseband signal, a frequency synthesizing system that outputs a synthesized intermediate frequency signal to the intermediate frequency modulator, and a means for generating a signal input to the digital modulator, the signal having a frequency including an offset that allows the frequency synthesizing system and the intermediate frequency modulator to make frequency steps equal to the channel bandwidth.

Another embodiment of the present invention provides a system for modulating data onto a carrier signal in a plurality of channels, each of the channels having a channel bandwidth. The system comprises a digital modulator that outputs a modulated baseband signal, an intermediate frequency modulator that receives the modulated baseband signal and outputs an intermediate frequency signal derived from the modulated baseband signal, a frequency synthesizing system that outputs a synthesized intermediate frequency signal to the intermediate frequency modulator, and a means for generating a signal input to the digital modulator, the signal having a frequency including an offset that compensates for Doppler effect in transmission of the carrier signal.

Additional advantages and novel features of the invention will be set forth in the description which follows or may be learned by those skilled in the art through reading these materials or practicing the invention. The advantages of the invention may be achieved through the means recited in the attached claims.

BRIEF DESCRIPTION OF THE DRAWINGS

The accompanying drawings illustrate preferred embodiments of the present invention and are a part of the specification. Together with the following description, the drawings demonstrate and explain the principles of the present invention. The illustrated embodiments are examples of the present invention and do not limit the scope of the invention.

Throughout the drawings, identical reference numbers designate similar, though not necessarily identical, elements.

DETAILED DESCRIPTION OF THE PREFERRED EMBODIMENTS

The present invention provides a method and system whereby a very fast tuning QPSK modulator and upconverter can be used in two-way satellite communication systems to transmit data while meeting the typical two-way satellite communication system design goals of low phase noise, low spurious emissions levels, large frequency hopping range, small frequency settling time, fine frequency accuracy and step size to correct the Doppler effect, and small amplitude and group delay variation across the hopping band. Such design goals could apply to any and all two-way satellite communication systems as well as to other applications where cost-effective wireless communication is desired using the $K_a$-band. The present invention, therefore, applies to any and all two-way satellite communication systems as well as to other applications where wireless communication is desired using the $K_a$-band.

Additionally, the present invention provides a method and system of correcting the Doppler effect without introducing out-of-channel spurious emission levels that exceed Adjacent Channel Emissions (ACE) specifications. Under the principles of the present invention, as will be explained in more detail below in connections with FIG. 3, the Doppler effect is corrected by slightly varying the frequency produced by the Numerically Controlled Oscillator (NCO) in the digital upconversion stage.

The present invention also provides a method and system of generating a large analog IF frequency synthesizer step size so that the phase noise is low and within the deemed acceptable levels as specified by wireless communication regulatory bodies. Under the principles of the present invention, as will be explained in more detail below, an offset is generated by the NCO in the digital upconversion stage that allows the analog IF frequency synthesizer step size to be large. This offset is combined with the frequency offset required to correct the Doppler effect into one frequency offset.

Using the drawings, the preferred embodiments of the present invention will now be explained.

Figure 1:
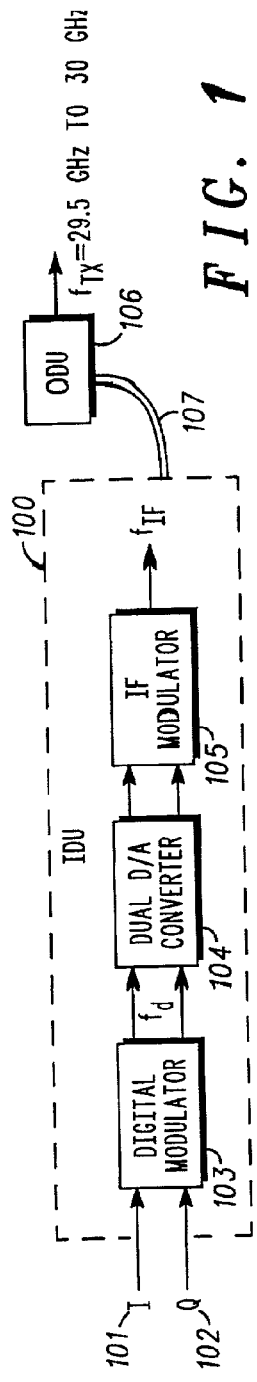
FIG. 1 is a basic block diagram of a multi-stage modulator and upconverter that is used in a two-way satellite communication system and that could be used to implement the present invention.

FIG. 1 is a basic block diagram of a multi-stage modulator and upconverter that is used in a two-way satellite communication system and that could be used to implement the present invention. Baseband QPSK I (101) and Q (102) signals are modulated and upconverted to an intermediate frequency (IF), $f_{IF}$, in the IDU (100). This modulation and upconversion is done in two stages within the IDU (100). First, the I (101) and Q (102) signals are modulated digitally with a digital modulator (103). A more detailed description of the digital modulator (103) will be given below in connection with FIG. 2. The digital modulator (103) upconverts the I (101) and Q (102) signals from baseband to a frequency, $f_d$. This frequency, $f_d$, is preferably much lower than both the transmitted signal channel bandwidth and the IF, $f_{IF}$. An example of a possible, but not exclusive, value for $f_d$ is less than 10–20 percent of the transmitted signal channel bandwidth. This key constraint on $f_d$ eases many aspects of the upconverter and synthesizer designs as will be described below in more detail in connection with FIG. 6. The output signals of the digital modulator (103) each contain modulated I (101) and Q (102) signals. As explained before, the I (101) and Q (102) signals are orthogonal, or 90 degrees out of phase. Thus, they are totally independent and can be combined into one signal and then later separated without the loss of information The resulting two output signals of the digital modulator (103) are then converted from digital signals to analog signals. This conversion is done using a Dual DAC (104). Because the digital to analog conversion is done at a relatively low frequency, the Dual DAC (104) can be easily designed and is cost-effective for most applications.

If, on the other hand, a digital modulator (102) is used without the analog IF modulator (105) (i.e. the IF modulator block (105) is removed from the block diagram of FIG. 1) to upconvert to the IF, $f_{IF}$, the conversion from digital to analog would need to take place at a much higher frequency (e.g., 1.7–2.2 GHz). This would result in the Dual DAC (104) having to operate at this higher frequency of 1.7–2.2 GHz. Currently, such Dual DAC's (104) are difficult and costly to design and produce.

Once the two output signals of the digital modulator (103) have been converted from digital signals to analog signals with the Dual DAC (104), they are again modulated, this time with an analog IF modulator (105). A more detailed description of the IF modulator (105) will be given below in connection with FIG. 2. The IF modulator (105) modulates the two output signals of the digital modulator (103) and then combines the two signals into one signal. This combined signal is upconverted by the IF modulator (105) from the frequency, $f_d$, to the IF, $f_{IF}$. The IF, $f_{IF}$, is within, but not limited to, the L-band range (e.g., 1.7–2.2 GHz). This range is preferable because it is high enough that the ODU (106) upconversion will allow filtering of the ODU (106) local oscillator (LO).

The signal is then fed from the IDU (100) to the ODU (106) via a connecting cable (107). The connecting cable (107) is preferably one with low loss. An example of a suitable connecting cable (107) is RG-6 cable, currently used with many other applications, such as digital satellite television set-tops. The ODU (106) is located at the transmitting terminal's antenna. The ODU (106) modulates the signal received from the IDU (100) and upconverts it to the transmit frequency, $f_{TX}$. The transmit frequency, $f_{TX}$, is between 29.5 and 30 GHz, frequencies for operation within the $K_a$-band. Once the signal has been upconverted to the frequency $f_{TX}$, it is ready for transmission.

A more detailed description of the digital modulator (103), analog IF modulator (105), and the circuitry in between the two modulation stages—all or some of which might be used to implement the present invention—will now be given using the detailed block diagram of FIG. 2.

Figure 2:
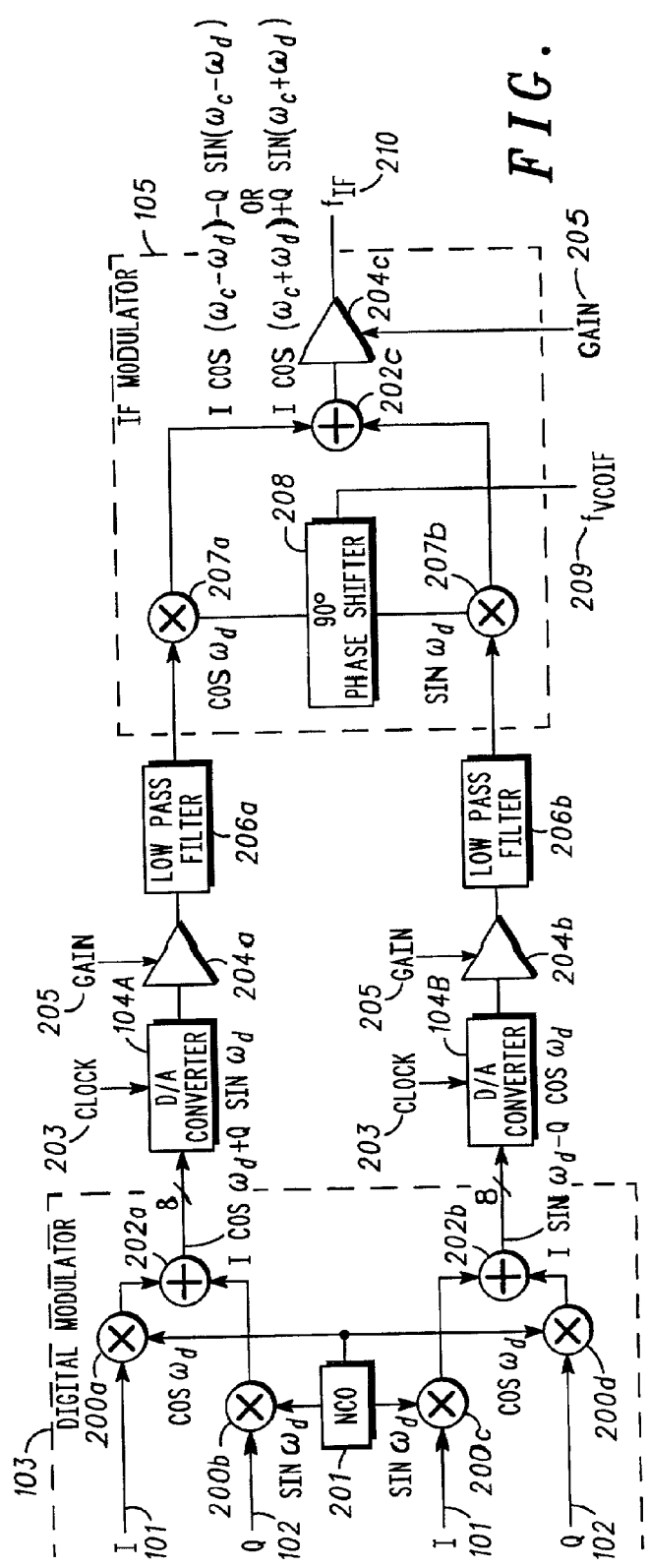
FIG. 2 is a detailed block diagram of a digital modulator and a IF modulator with which the present invention could be practiced.

FIG. 2 shows the detailed block diagram of the digital modulator (103) and the IF modulator (105). The digital modulator (103) can be implemented using a variety of methods. Possible methods of the digital modulator (103) implementation include software-defined digital signal processing chips (DSPs), field-programmable gate arrays (FPGAs), application-specific integrated circuits (ASICs), and other types of integrated circuits (ICs).

The components of the digital modulator (103), shown in FIG. 2, will now be explained.

A numerically controlled oscillator (NCO) (201) generates two signals centered at a frequency $\omega_d$: $\sin \omega_d$ and $\cos \omega_d$. The frequency, $\omega_d$, refers to the same frequency as does the frequency, $f_d$. The only difference is that $\omega d$ is expressed in radians and $f_d$ is expressed in Hertz. Thus, as used hereafter and in the appended claims, $\omega_x$ refers to the same frequency as does $f_x$, where 'x' is an arbitrary subscript.

As shown in FIG. 2, the I signal (101) and the $\cos \omega_d$ signal are multiplied with a multiplier (200a). The Q signal (102) and the $\sin \omega_d$ signal are also multiplied using another multiplier (200b). The resulting products from multipliers (200a) and (200b) are then added with an adder (202a). The adder blocks (202a,b,c) are designed to perform either addition or subtraction and can be programmed to perform either operation. The resulting signal contains both the I (101) and Q (102) signals and is I $\cos \omega_d$+Q $\sin \omega_d$.

Simultaneously, the I signal (101) and the $\sin \omega_d$ signal are multiplied with a multiplier (200c). The product of the Q signal (102) and the $\cos \omega_d$ signal, obtained by using another multiplier (200d), is subtracted, using another adder (202b), from the result of the multiplier (200c). The resulting signal also contains both the I (101) and Q (102) signals and is I $\sin \omega_d$–Q $\cos \omega_d$.

Both output signals of the digital modulator (103), I $\cos \omega_d$+Q $\sin \omega_d$ and I $\sin \omega_d$–Q $\cos \omega_d$, are input into Dual DACs (104a,b). Depending on the application and method of implementation of the digital modulator (103), a certain amount of bits of the digital modulator (103) output signals are output at a given instant. An example, as shown in FIG. 2, would be that the output signals arrive at the dual DACs (104a,b) in 8-bit increments.

The circuitry found between the digital modulator (103) and the analog IF modulator (105) will now be explained using FIG. 2.

Figure 3:
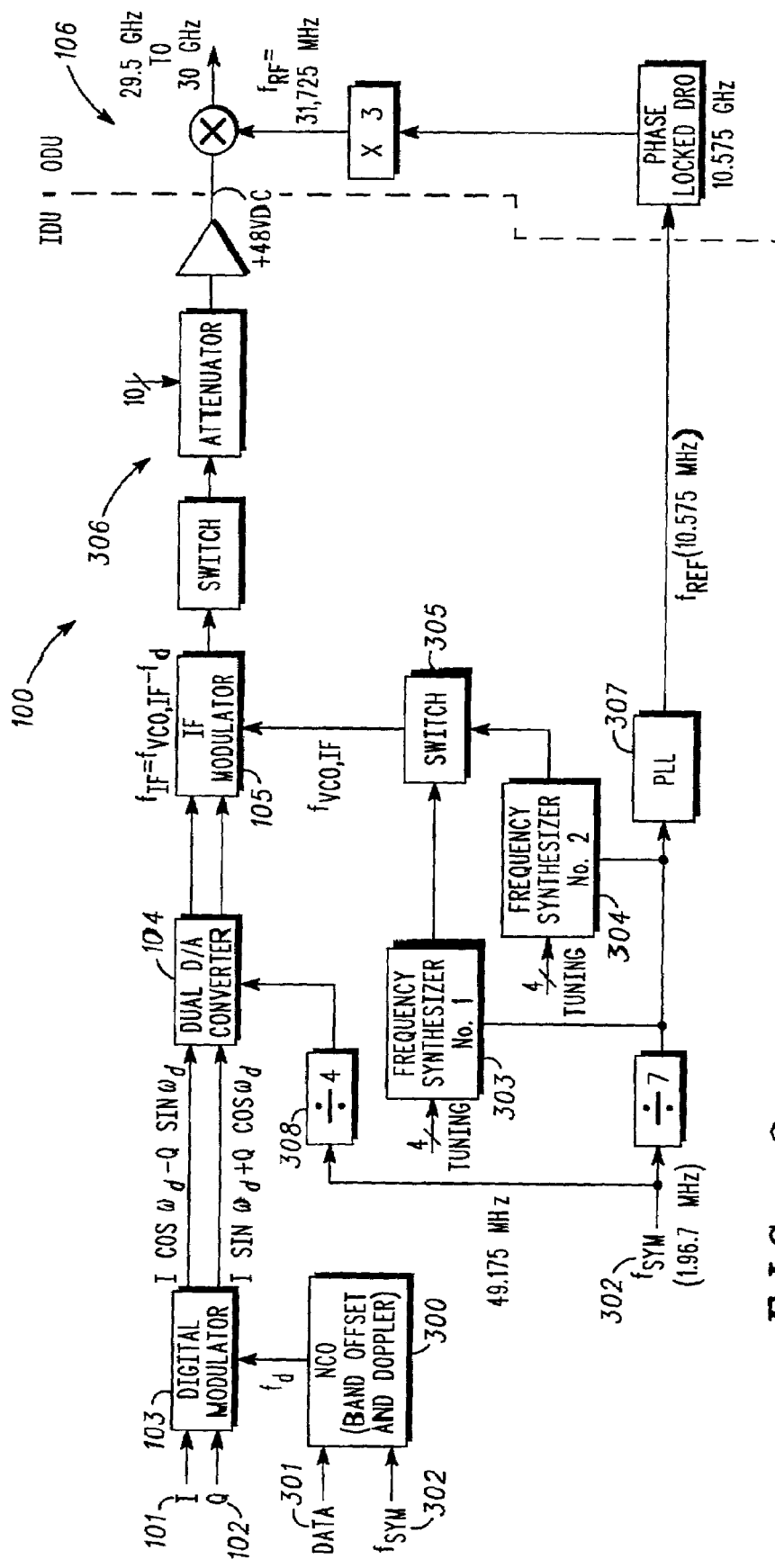
FIG. 3 illustrates a configuration whereby a numerically controlled oscillator (NCO) generates a frequency offset near baseband that allows for a large frequency step size for the frequency synthesizers and corrects the Doppler effect according to an embodiment of the present invention.

As explained in connection with FIG. 1, Dual DACs (104a,b) convert the digital output signals from the digital modulator (103) to analog signals. The Dual DACs (104a,b) are controlled with an external clock signal (203). This clock signal (203) determines when the Dual DACs (104a,b) sample and then hold the two output signals of the digital modulator (103). This clock signal (203) is generated by dividing the receive symbol clock, $f_{SYM}$ (302; FIG. 3), by an integer using a divider block (308; FIG. 3), as shown in FIG. 3. The receive symbol clock, $f_{SYM}$ (302), is recovered from the receiving data obtained from the satellite downlink signal and is a large multiple of the transmit symbol clock in this example. This allows the transmitter to maintain time synchronism with the satellite oscillators that generate $f_{SYM}$.

Returning to FIG. 2, the two analog signals are then amplified by a specific gain (205) with amplifiers (204a,b). This is a common practice in upconverter design. Because of signal scaling and attenuation that occurs in the digital modulation (103) stage as well as in the Dual DACs (104a, b), the signals need to be amplified before being modulated again by the analog IF modulator (105).

After being amplified, the two analog signals are then low pass filtered by low pass filters (LPFs) (206a,b) to remove the possible interference present at unwanted frequencies that would alias down and interfere with the desired signal during the detection process.

The components of the analog IF modulator (105), shown in FIG. 2, will now be explained.

An example of an analog IF modulator (105) that might be used in two-way satellite communication systems is the RF2483 IQ modulator made by RF MicroDevice™. Other models made by the same or different companies might also be used. Inside the analog IF modulator (105), a 90° Phase Shifter (208) splits a carrier signal of frequency $\omega_c$ into two signals: sin $\omega_c$ and cos $\omega_c$. The carrier frequency, $\omega_c$, is generated by an analog frequency synthesizer which outputs a frequency, $f_{VCO,IF}$ (209). The frequency synthesizer will be explained in more detail below in connection with FIG. 3 and FIG. 4. The output from the top LPF (206a) is mixed with the cos $\omega_c$ signal using an analog mixer (207a). The resulting signal is I cos $\omega_c$ cos $\omega_d$+Q cos $\omega_c$ sin $\omega_d$. The other LPF's (206b) output is mixed with the sin $\omega_c$ signal using a second analog mixer (207b). Its resulting signal is I sin $\omega_c$ sin $\omega_d$–Q sin $\omega_c$ cos $\omega d$. These two signals can then be either added or subtracted, depending on the type of IF transmit signal ($f_{IF}$) (210) desired. If a lower sideband signal, or a signal centered at a frequency lower than $\omega_c$, is desired, the two signals are added by the adder (202c). Using common trigonometric identities, it can be shown that the resulting output of the adder (202c) is I cos ($\omega_c-\omega_d$)–Q sin ($\omega_c-\omega_d$). Likewise, if an upper sideband signal, or a signal centered at a frequency higher than $\omega_c$, is desired, the two signals are subtracted by the adder (202c). Using trigonometric identities, it can be shown that the resulting output of the adder (202c) in this case is I cos ($\omega_c+\omega_d$)+Q sin ($\omega_c+\omega_d$). In the case of some satellite communication systems, the lower sideband signal is desired. Therefore, the adder (202c) is programmed to add. The output of the adder (202c) is then amplified by a gain variable amplifier (204c). This provides a good dynamic range to control the output power. The amplified signal is the IF signal with frequency $f_{IF}$ (210).

FIG. 3 illustrates the embodiments of the present invention. More specifically, the embodiments entail a method and system whereby the NCO (300) generates a frequency offset near baseband. The frequency offset allows for a larger frequency step size than is traditionally used for the analog frequency synthesizers (303,304). The frequency offset also compensates for the Doppler effect. The embodiments will be explained in more detail below.

Figure 4:
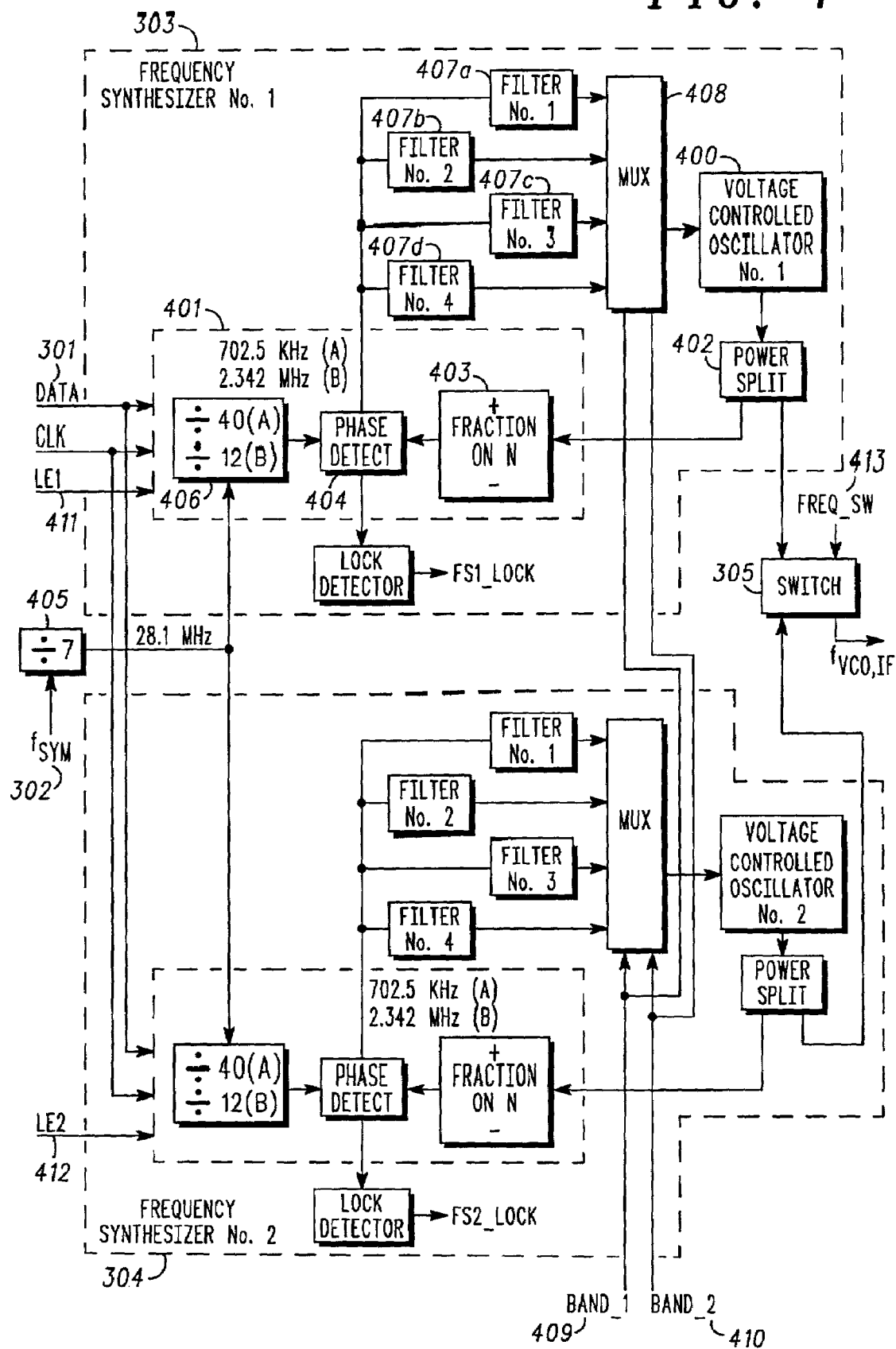
FIG. 4 shows the specific components of the frequency synthesizers that could be used to implement the present invention.

As shown in FIG. 3 and in the case of some $K_a$-band two-way satellite communication systems, there are two frequency synthesizers (303,304) that generate $f_{VCO,IF}$ for the analog IF modulator (105). The two frequency synthesizers (303,304) are set up in a ping-pong configuration. This means that while one frequency synthesizer (e.g., 303) locks into the desired frequency, the other frequency synthesizer (e.g., 304) tunes to the next desired frequency that will be hopped to. This next frequency is determined by the receiving data (301). The system dwells on the first frequency for a set amount of time (e.g., 962 microseconds) before a control signal, Freq_SW (413; FIG. 4), indicates to the switch (305) to switch to the frequency generated by the second frequency synthesizer (304). The ping-pong configuration allows for switching between hopping frequencies of the frequency synthesizers (303,304) within a few nanoseconds.

FIG. 4 shows the specific components of the frequency synthesizers (303,304) that could be used in conjunction with the present invention. The control signal LE1 (411) is high if the frequency command data (301) is to be input into frequency synthesizer 1 (303). Likewise, the control signal LE2 (412) is high if the data (301) is to be input into frequency synthesizer 2 (304).

The components that comprise the frequency synthesizer 1 (303) will now be explained. The frequency synthesizer 2 (304) has identical components, most of which are not labeled with numbers in FIG. 4. The words "frequency synthesizer" will be used to refer to the frequency synthesizer 1 (303) in the following explanation.

The frequency synthesizer (303) is comprised of an electronic circuit with a voltage controlled oscillator (VCO) (400) that is constantly adjusted to match, in phase, the frequency of an input signal. The output of the VCO (400) is $f_{VCO,IF}$. This output is fed back into a frequency synthesizer chip (401) via a power split (402). A preferred frequency synthesizer chip (401) for such a $K_a$-band two-way satellite communication system is the LMX2350 chip made by National Semiconductor™. However, other models of frequency synthesizer chips (401) made by the same or different companies might also be used.

The frequency synthesizer chip (401) is programmable. The programmable functions are accessed through a serial interface. This serial interface is the same as the data input (301). Within the frequency synthesizer chip, there is a fraction-N frequency synthesizer (403). This takes the signal generated by the VCO (400) and, in turn, generates a signal (e.g., a sine wave) of frequency $f_{VCO,IF}$ that is input into a phase detector (404). The phase detector (404) also has a second input which is a signal with the desired step size frequency. The desired step size frequency for the example class A two-way satellite communication system is 702.5 kHz. For a class B system, the desired step size frequency is 3.5125 MHz. The reasoning behind the choice of these specific step size frequencies will be explained in more detail below in connection with FIG. 5. However, other two-way satellite communication systems may employ different channel bandwidths and, hence, have different step sizes.

As shown in FIG. 4, the desired step size frequency is derived using a series of divider blocks (405,406). The symbol clock, $f_{SYM}$ (302), is divided with a divide-by-7 block (405). The resulting frequency is 28.1 MHz. This frequency can be divided by using another divider block (406) to give the desired comparison frequency which derives the step size frequency. This divider block (406) is preferably inside the frequency synthesizer chip (401). Its dividing number can be programmed by the user. In, for example, a class A system, the dividing number is 40 because 28.1 MHz divided by 40 equals 702.5 kHz, the desired step size frequency. Likewise, for a class B system, the dividing number is 12, resulting in a comparison frequency of 2.34 MHz that generates a step size of 3.5125 MHz in the frequency synthesizers (303,304). In other applications, the dividing numbers of the divider blocks (405,406) can be modified based on the desired frequency step size.

Returning to the description of the phase detector (404) of FIG. 4, the phase of the desired step size frequency is compared by the phase detector (404) to the phase of the frequency of the signal output of the fraction-N frequency synthesizer (403). If the phases are different, the frequency of the output signal of the fraction-N frequency synthesizer (403) is not a multiple of the frequency step size. Therefore, the phase detector (404) outputs a signal with an increased or decreased voltage level signaling to the VCO (400) to either increase or decrease the frequency of the signal which it outputs. This feedback loop continues until the phases of the step size frequency and the output signal of the fraction-N frequency synthesizer (404) are identical.

As shown in FIG. 4, there is a bank of 4 different loop filters (407a–d) between the phase detector (404) and the VCO (400). Only one loop filter (e.g., 407a) is used at a time. The band number, class of system (either class A or class B), and desired $f_{VCO,IF}$ determines which loop filter (407a–d) is to be used. A multiplexor (MUX) (408), controlled by the control signals Band_1 (409) and Band_0 (410), chooses which of the 4 loop filters (407a–d) is used. The loop filters (407a–d) are used to add stability to the system, reject spurious noise, and decrease the settling time. In the case of many $K_a$-band two-way satellite communication systems, the frequency will hop only within one band, so the MUXes (408) in each of the frequency synthesizers (303,304) share the same control signals (409,410). The commands to choose which loop filter (407a–d) that is used, in the case of an exemplary $K_a$-band two-way satellite communication system, are listed in Table 1.

TABLE 1

Loop Filter Selection Commands

| | $f_{VCO,IF}$ | Loop Filter (407a–d) # | Band_1 (409) | Band_0 (410) |
|---|---|---|---|---|
| Class A, Band 1 | 2.224 to 2.101 GHz | 1 | 0 | 0 |
| Class A, Band 2 | 2.099 to 1.976 GHz | 1 | 0 | 0 |
| Class A, Band 3 | 1.974 to 1.851 GHz | 2 | 0 | 1 |
| Class A, Band 4 | 1.849 to 1.726 GHz | 2 | 0 | 1 |
| Class B, Band 1 | 2.223 to 2.102 GHz | 3 | 1 | 0 |
| Class B, Band 2 | 2.098 to 1.977 GHz | 3 | 1 | 0 |
| Class B, Band 3 | 1.973 to 1.852 GHz | 4 | 1 | 1 |
| Class B, Band 4 | 1.848 to 1.727 GHz | 4 | 1 | 1 |

Figure 5:
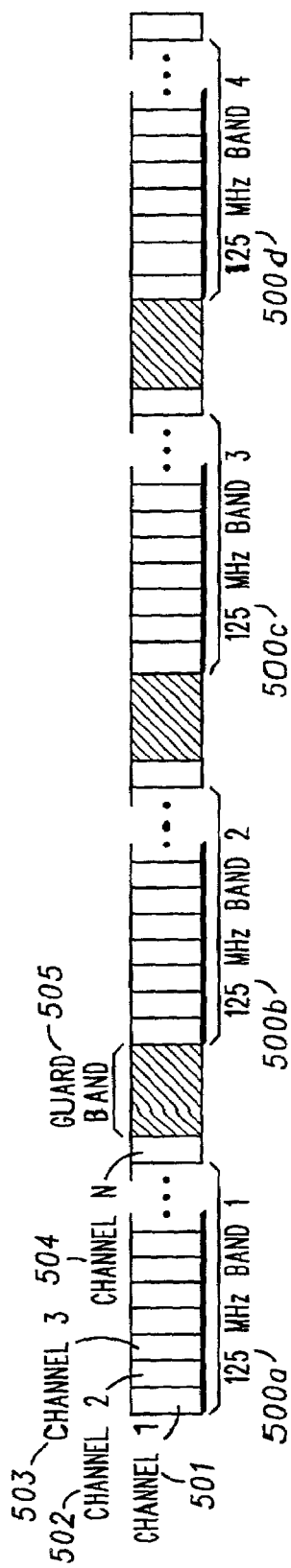
FIG. 5 shows the divisions of the frequency bands which are used by two-way satellite communication systems.

FIG. 5 will be used in conjunction with FIG. 3 to explain the first embodiment whereby the NCO (300; FIG. 3) generates an offset that allows for a large frequency step size for the analog frequency synthesizers (303,304; FIG. 3). As shown in FIG. 5, there are 4 approximately 125 MHz bands (500a–d) within which the example two-way satellite communication system operates. Each band is partitioned into a set number (n) of channels, depending on the application. FIG. 5 shows channels 1 (501), 2 (502), 3 (503), and n (504). In the case of an exemplary $K_a$-band two-way satellite communication system, the bands (500a–d) are partitioned into either n=175 channels for Class A systems or n=35 channels for class B systems.

Each channel (e.g., 501) in a particular band (e.g., 500a) has a bandwidth equal to the bandwidth of all the other channels (e.g., 502–504) in the four 125 MHz bands (500a–d). For class A systems, the channel (501–504) bandwidth is 702.5 KHz. For class B systems, the channel (501–504) bandwidth is 3.5125 MHz.

In between each of the 125 MHz bands (500a–d) there is a guard band (505). The guard band's (505) width, in the case of an exemplary $K_a$-band two-way satellite communication system, is 2.0625 MHz. This bandwidth is not a multiple of the channel (501–504) bandwidths. Thus, there are not a fixed number of channel bandwidth spacings in between the n'th channel (504) of one band (e.g., 500a) and the first channel of an adjacent band (e.g., 500b). This makes it impractical to use a frequency synthesizer (303,304) with a frequency step size equal to the channel (e.g., 501) bandwidth's size unless a design is implemented that gives an offset frequency of the right amount so as to allow the use of a step size equal to the channel (e.g., 501) bandwidth's size. By generating a frequency offset with the NCO (300; FIG. 3), the channel (e.g., 501) bandwidth's size can be used as the size of the step size for the frequency synthesizers (303,304).

The number of channels (501–504), channel (501–504) bandwidths, band (500a–d) widths, and guard band (505) widths are dependent on the particular application and can vary. The present invention covers all such possibilities.

An illustration of the procedure used to generate the frequency offset required to maintain a desired step size for the frequency synthesizers (303,304) with the NCO (300; FIG. 3) will be given using the example class A system. Similar procedures could be used with other applications. FIG. 5 will be referenced during this illustration.

A class A system has channel bandwidths of 702.5 kHz. The spacing between the center frequency of channel n=175 (504) of band 1 (500a) and the center frequency of channel 1 (501) of band 2 (500b) is 2.0625 MHz+702.5 kHz=2.765 MHz. Dividing this number by the channel (e.g., 501) bandwidth (702.5 kHz) gives 3.9359. This is obviously not an integer and therefore a step size of 702.5 kHz for the frequency synthesizers (303,304; FIG. 3) would not normally be used to frequency hop between the center frequencies of the channels (501–504) across all four bands (500a–d).

Because 2,765,000,000=(5^4)*(2^3)*7*79 (where x^y means x raised to the y-th power and * is multiplication) and 702,500=(5^4)*(2^2)*3*11, the greatest common devisor between these two numbers is (5^4)*(2^2)=2,500 Hz. Thus, the frequency synthesizers (303,304; FIG. 3) would normally need to have a step size of 2,500 Hz to be able to hit the channel (501–504) center frequencies across the four 125 MHz bands (500a–d).

Referring now to FIG. 3, by adding or subtracting a small frequency offset in the digital modulation stage (103) with the NCO (300), 702.5 kHz is used as the step size for the frequency synthesizers (303,304). The amount of frequency offset depends on the band number (500a–d; FIG. 5) and can be calculated a priori for input to the NCO (300). This band offset is fixed for all the channels within a given 125 MHz band. Using this information, the NCO (300) can adjust the amount of frequency offset that it is providing to the amount of frequency offset needed to allow a frequency step size of 702.5 kHz.

FIG. 3 also shows that the frequency offset generated by the NCO (300) includes a frequency offset that compensates for the Doppler effect in addition to the small fixed band offset that adjusts for hopping within a given band. By compensating for the slowly varying, low frequency Doppler effect and band offset near baseband, the spurious noise emissions that result from such correction lie close to the bandwidth of the signal. This is in contrast to other methods that use the NCO (300) to perform simultaneous Doppler correction frequency hopping across all or a subset of the channels within a band (500a–d; FIG. 5) while employing analog frequency synthesizers (303,304) that center this digital output within the band. In other words, the spurious noise from the intermodulation products at $\pm nf_{VCO,IF} \pm mf_d$ only changes by the $\pm mf_d$ factor. An example will be given with a class A system using FIG. 6 and FIG. 7.

Figure 6:
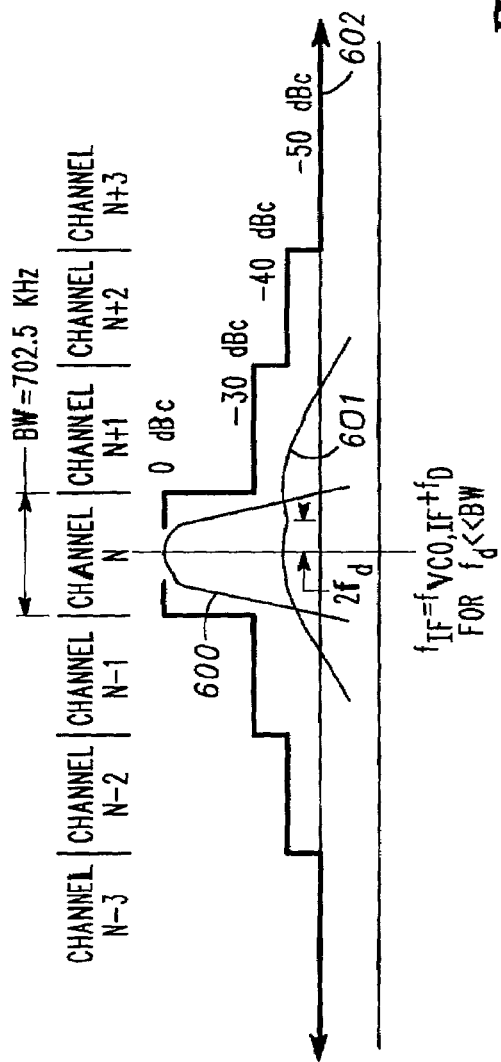
FIG. 6 shows the frequency spectrum of a transmitted signal and its associated spurious noise in an exemplary two-way satellite communication system under the embodiments of the present invention.

FIG. 6 shows a transmitted signal (600) in the frequency domain. If the NCO (300; FIG. 3) frequency offset, $f_d$, is much smaller than the signal channel bandwidth (BW) (e.g., 702.5 kHz), then spurious noise (601) near the desired IF output at $F_{VCO,IF}+f_d$ will lie near the desired channel BW and, in general, fall within a specified adjacent channel emissions mask (602). This adjacent channel emissions mask (602) dictates the level of spurious noise (601) that can be present in any given channel.

Figure 7:
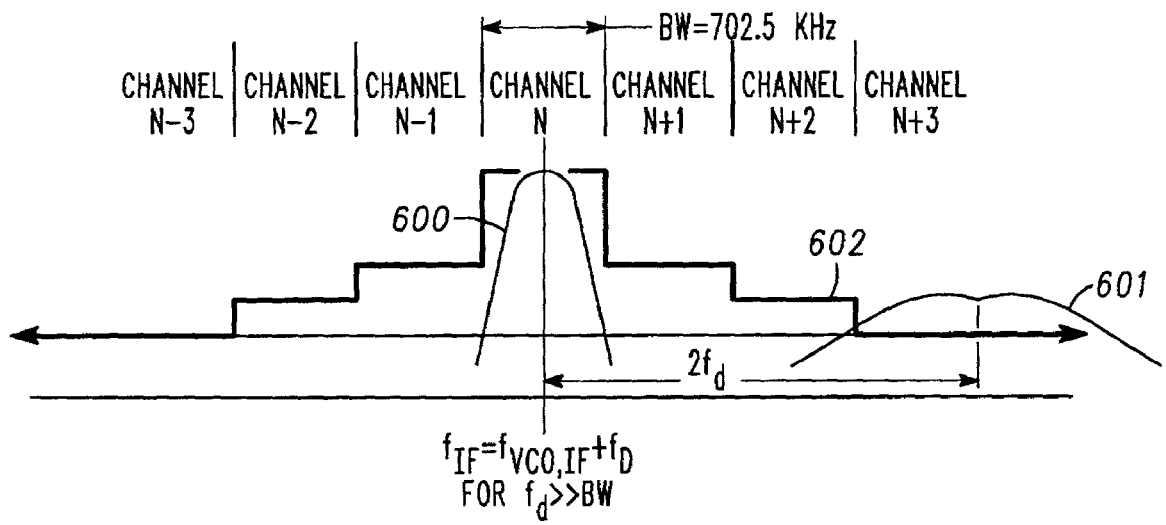
FIG. 7 shows the frequency spectrum of a transmitted signal and its associated spurious noise in an exemplary two-way satellite communication system where the embodiments of the present invention are not used.

However, as shown in FIG. 7, if the NCO (300; FIG. 3) performs channel frequency hopping and Doppler correction, $f_d$ changes in multiples of the channel BW and the intermodulation products, or spurious noise (601), will fall in adjacent channel bands and will likely exceed the adjacent channel emissions mask (602), as shown in FIG. 7. Filtering these emissions for a large hopping $f_d$ can be complicated and costly while no filtering is needed for the smaller $f_d$ of the example given in FIG. 6.

Returning to FIG. 3, the amount of frequency compensation that the NCO (300) must provide to compensate for the Doppler effect is extracted from the received data (301). In the case of an exemplary $K_a$-band two-way satellite communication system, this method of Doppler effect correction is capable of a compensation resolution of 0.5 Hz or less. Other levels of compensation resolution could be required and achieved depending on the application.

As FIG. 3 shows, the NCO (300) generates a frequency offset that results in a large frequency step size and at the same time compensates for the Doppler effect. The method of generating the appropriate offset frequency that results in a large frequency step size and at the same time compensates for the Doppler effect in the class A and class B systems will now be explained. First, the desired $f_{VCO,IF}$ is generated by programming specific values into the frequency synthesizer chip (401; FIG. 4). In the class A system, $f_{VCO,IF}$ is represented by the following equation: $f_{VCO,IF} = f_{SYM} * (N+F/16)/280$. In the class B system, $f_{VCO,IF}$ is represented by the following equation: $f_{VCO,IF} = f_{SYM} * (N+F/16)/84$. N and F are parameters that are programmed into the frequency synthesizer chip (401). As can be seen in the given equations for $f_{VCO,IF}$, varying N and F results in different values of $f_{VCO,IF}$.

After $f_{VCO,IF}$ has been generated, it is then subtracted from the desired IF frequency, $f_{IF}$, to give the needed frequency offset that the NCO (300) must produce to result in the desired step size (702.5 kHz for class A systems and 3.5125 MHz for class B systems). As an example of the values of F and N that are needed to generate different values of $f_{VCO,IF}$, as well as the resulting frequency offset that the NCO (300) generates, Tables 2–9 list the tuning commands for the all the channels in the class A and class B systems.

TABLE 2

Tuning Commands for Class A - Band 1

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 1 | 1 | 29,501,382,500 | 2,223,617,500 | 2,223,675,937.5 | 58,437.5 | 6 | 3165 |
| 1 | 2 | 29,502,085,000 | 2,222,915,000 | 2,222,973,437.5 | 58,437.5 | 6 | 3164 |
| 1 | 3 | 29,502,787,500 | 2,222,212,500 | 2,222,270,937.5 | 58,437.5 | 6 | 3163 |
| 1 | 4 | 29,503,490,000 | 2,221,510,000 | 2,221,568,437.5 | 58,437.5 | 6 | 3162 |
| 1 | 5 | 29,504,192,500 | 2,220,807,500 | 2,220,865,937.5 | 58,437.5 | 6 | 3161 |
| 1 | 6 | 29,504,895,000 | 2,220,105,000 | 2,220,163,437.5 | 58,437.5 | 6 | 3160 |
| 1 | 7 | 29,505,597,500 | 2,219,402,500 | 2,219,460,937.5 | 58,437.5 | 6 | 3159 |
| 1 | 8 | 29,506,300,000 | 2,218,700,000 | 2,218,758,437.5 | 58,437.5 | 6 | 3158 |
| 1 | 9 | 29,507,002,500 | 2,217,997,500 | 2,218,055,937.5 | 58,437.5 | 6 | 3157 |
| 1 | 10 | 29,507,705,000 | 2,217,295,000 | 2,217,353,437.5 | 58,437.5 | 6 | 3156 |
| 1 | 11 | 29,508,407,500 | 2,216,592,500 | 2,216,650,937.5 | 58,437.5 | 6 | 3155 |
| 1 | 12 | 29,509,110,000 | 2,215,890,000 | 2,215,948,437.5 | 58,437.5 | 6 | 3154 |
| 1 | 13 | 29,509,812,500 | 2,215,187,500 | 2,215,245,937.5 | 58,437.5 | 6 | 3153 |
| 1 | 14 | 29,510,515,000 | 2,214,485,000 | 2,214,543,437.5 | 58,437.5 | 6 | 3152 |
| 1 | 15 | 29,511,217,500 | 2,213,782,500 | 2,213,840,937.5 | 58,437.5 | 6 | 3151 |
| 1 | 16 | 29,511,920,000 | 2,213,080,000 | 2,213,138,437.5 | 58,437.5 | 6 | 3150 |
| 1 | 17 | 29,512,622,500 | 2,212,377,500 | 2,212,435,937.5 | 58,437.5 | 6 | 3149 |
| 1 | 18 | 29,513,325,000 | 2,211,675,000 | 2,211,733,437.5 | 58,437.5 | 6 | 3148 |
| 1 | 19 | 29,514,027,500 | 2,210,972,500 | 2,211,030,937.5 | 58,437.5 | 6 | 3147 |
| 1 | 20 | 29,514,730,000 | 2,210,270,000 | 2,210,328,437.5 | 58,437.5 | 6 | 3146 |
| 1 | 21 | 29,515,432,500 | 2,209,567,500 | 2,209,625,937.5 | 58,437.5 | 6 | 3145 |
| 1 | 22 | 29,516,135,000 | 2,208,865,000 | 2,208,923,437.5 | 58,437.5 | 6 | 3144 |
| 1 | 23 | 29,516,837,500 | 2,208,162,500 | 2,208,220,937.5 | 58,437.5 | 6 | 3143 |
| 1 | 24 | 29,517,540,000 | 2,207,460,000 | 2,207,518,437.5 | 58,437.5 | 6 | 3142 |
| 1 | 25 | 29,518,242,500 | 2,206,757,500 | 2,206,815,937.5 | 58,437.5 | 6 | 3141 |
| 1 | 26 | 29,518,945,000 | 2,206,055,000 | 2,206,113,437.5 | 58,437.5 | 6 | 3140 |
| 1 | 27 | 29,519,647,500 | 2,205,352,500 | 2,205,410,937.5 | 58,437.5 | 6 | 3139 |
| 1 | 28 | 29,520,350,000 | 2,204,650,000 | 2,204,708,437.5 | 58,437.5 | 6 | 3138 |
| 1 | 29 | 29,521,052,500 | 2,203,947,500 | 2,204,005,937.5 | 58,437.5 | 6 | 3137 |
| 1 | 30 | 29,521,755,000 | 2,203,245,000 | 2,203,303,437.5 | 58,437.5 | 6 | 3136 |
| 1 | 31 | 29,522,457,500 | 2,202,542,500 | 2,202,600,937.5 | 58,437.5 | 6 | 3135 |
| 1 | 32 | 29,523,160,000 | 2,201,840,000 | 2,201,898,437.5 | 58,437.5 | 6 | 3134 |
| 1 | 33 | 29,523,862,500 | 2,201,137,500 | 2,201,195,937.5 | 58,437.5 | 6 | 3133 |
| 1 | 34 | 29,524,565,000 | 2,200,435,000 | 2,200,493,437.5 | 58,437.5 | 6 | 3132 |
| 1 | 35 | 29,525,267,500 | 2,199,732,500 | 2,199,790,937.5 | 58,437.5 | 6 | 3131 |
| 1 | 36 | 29,525,970,000 | 2,199,030,000 | 2,199,088,437.5 | 58,437.5 | 6 | 3130 |
| 1 | 37 | 29,526,672,500 | 2,198,327,500 | 2,198,385,937.5 | 58,437.5 | 6 | 3129 |
| 1 | 38 | 29,527,375,000 | 2,197,625,000 | 2,197,683,437.5 | 58,437.5 | 6 | 3128 |
| 1 | 39 | 29,528,077,500 | 2,196,922,500 | 2,196,980,937.5 | 58,437.5 | 6 | 3127 |
| 1 | 40 | 29,528,780,000 | 2,196,220,000 | 2,196,278,437.5 | 58,437.5 | 6 | 3126 |
| 1 | 41 | 29,529,482,500 | 2,195,517,500 | 2,195,575,937.5 | 58,437.5 | 6 | 3125 |
| 1 | 42 | 29,530,185,000 | 2,194,815,000 | 2,194,873,437.5 | 58,437.5 | 6 | 3124 |
| 1 | 43 | 29,530,887,500 | 2,194,112,500 | 2,194,170,937.5 | 58,437.5 | 6 | 3123 |
| 1 | 44 | 29,531,590,000 | 2,193,410,000 | 2,193,468,437.5 | 58,437.5 | 6 | 3122 |
| 1 | 45 | 29,532,292,500 | 2,192,707,500 | 2,192,765,937.5 | 58,437.5 | 6 | 3121 |
| 1 | 46 | 29,532,995,000 | 2,192,005,000 | 2,192,063,437.5 | 58,437.5 | 6 | 3120 |
| 1 | 47 | 29,533,697,500 | 2,191,302,500 | 2,191,360,937.5 | 58,437.5 | 6 | 3119 |

TABLE 2-continued

Tuning Commands for Class A - Band 1

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 1 | 48 | 29,534,400,000 | 2,190,600,000 | 2,190,658,437.5 | 58,437.5 | 6 | 3118 |
| 1 | 49 | 29,535,102,500 | 2,189,897,500 | 2,189,955,937.5 | 58,437.5 | 6 | 3117 |
| 1 | 50 | 29,535,805,000 | 2,189,195,000 | 2,189,253,437.5 | 58,437.5 | 6 | 3116 |
| 1 | 51 | 29,536,507,500 | 2,188,492,500 | 2,188,550,937.5 | 58,437.5 | 6 | 3115 |
| 1 | 52 | 29,537,210,000 | 2,187,790,000 | 2,187,848,437.5 | 58,437.5 | 6 | 3114 |
| 1 | 53 | 29,537,912,500 | 2,187,087,500 | 2,187,145,937.5 | 58,437.5 | 6 | 3113 |
| 1 | 54 | 29,538,615,000 | 2,186,385,000 | 2,186,443,437.5 | 58,437.5 | 6 | 3112 |
| 1 | 55 | 29,539,317,500 | 2,185,682,500 | 2,185,740,937.5 | 58,437.5 | 6 | 3111 |
| 1 | 56 | 29,540,020,000 | 2,184,980,000 | 2,185,038,437.5 | 58,437.5 | 6 | 3110 |
| 1 | 57 | 29,540,722,500 | 2,184,277,500 | 2,184,335,937.5 | 58,437.5 | 6 | 3109 |
| 1 | 58 | 29,541,425,000 | 2,183,575,000 | 2,183,633,437.5 | 58,437.5 | 6 | 3108 |
| 1 | 59 | 29,542,127,500 | 2,182,872,500 | 2,182,930,937.5 | 58,437.5 | 6 | 3107 |
| 1 | 60 | 29,542,830,000 | 2,182,170,000 | 2,182,228,437.5 | 58,437.5 | 6 | 3106 |
| 1 | 61 | 29,543,532,500 | 2,181,467,500 | 2,181,525,937.5 | 58,437.5 | 6 | 3105 |
| 1 | 62 | 29,544,235,000 | 2,180,765,000 | 2,180,823,437.5 | 58,437.5 | 6 | 3104 |
| 1 | 63 | 29,544,937,500 | 2,180,062,500 | 2,180,120,937.5 | 58,437.5 | 6 | 3103 |
| 1 | 64 | 29,545,640,000 | 2,179,360,000 | 2,179,418,437.5 | 58,437.5 | 6 | 3102 |
| 1 | 65 | 29,546,342,500 | 2,178,657,500 | 2,178,715,937.5 | 58,437.5 | 6 | 3101 |
| 1 | 66 | 29,547,045,000 | 2,177,955,000 | 2,178,013,437.5 | 58,437.5 | 6 | 3100 |
| 1 | 67 | 29,547,747,500 | 2,177,252,500 | 2,177,310,937.5 | 58,437.5 | 6 | 3099 |
| 1 | 68 | 29,548,450,000 | 2,176,550,000 | 2,176,608,437.5 | 58,437.5 | 6 | 3098 |
| 1 | 69 | 29,549,152,500 | 2,175,847,500 | 2,175,905,937.5 | 58,437.5 | 6 | 3097 |
| 1 | 70 | 29,549,855,000 | 2,175,145,000 | 2,175,203,437.5 | 58,437.5 | 6 | 3096 |
| 1 | 71 | 29,550,557,500 | 2,174,442,500 | 2,174,500,937.5 | 58,437.5 | 6 | 3095 |
| 1 | 72 | 29,551,260,000 | 2,173,740,000 | 2,173,798,437.5 | 58,437.5 | 6 | 3094 |
| 1 | 73 | 29,551,962,500 | 2,173,037,500 | 2,173,095,937.5 | 58,437.5 | 6 | 3093 |
| 1 | 74 | 29,552,665,000 | 2,172,335,000 | 2,172,393,437.5 | 58,437.5 | 6 | 3092 |
| 1 | 75 | 29,553,367,500 | 2,171,632,500 | 2,171,690,937.5 | 58,437.5 | 6 | 3091 |
| 1 | 76 | 29,554,070,000 | 2,170,930,000 | 2,170,988,437.5 | 58,437.5 | 6 | 3090 |
| 1 | 77 | 29,554,772,500 | 2,170,227,500 | 2,170,285,937.5 | 58,437.5 | 6 | 3089 |
| 1 | 78 | 29,555,475,000 | 2,169,525,000 | 2,169,583,437.5 | 58,437.5 | 6 | 3088 |
| 1 | 79 | 29,556,177,500 | 2,168,822,500 | 2,168,880,937.5 | 58,437.5 | 6 | 3087 |
| 1 | 80 | 29,556,880,000 | 2,168,120,000 | 2,168,178,437.5 | 58,437.5 | 6 | 3086 |
| 1 | 81 | 29,557,582,500 | 2,167,417,500 | 2,167,475,937.5 | 58,437.5 | 6 | 3085 |
| 1 | 82 | 29,558,285,000 | 2,166,715,000 | 2,166,773,437.5 | 58,437.5 | 6 | 3084 |
| 1 | 83 | 29,558,987,500 | 2,166,012,500 | 2,166,070,937.5 | 58,437.5 | 6 | 3083 |
| 1 | 84 | 29,559,690,000 | 2,165,310,000 | 2,165,368,437.5 | 58,437.5 | 6 | 3082 |
| 1 | 85 | 29,560,392,500 | 2,164,607,500 | 2,164,665,937.5 | 58,437.5 | 6 | 3081 |
| 1 | 86 | 29,561,095,000 | 2,163,905,000 | 2,163,963,437.5 | 58,437.5 | 6 | 3080 |
| 1 | 87 | 29,561,797,500 | 2,163,202,500 | 2,163,260,937.5 | 58,437.5 | 6 | 3079 |
| 1 | 88 | 29,562,500,000 | 2,162,500,000 | 2,162,558,437.5 | 58,437.5 | 6 | 3078 |
| 1 | 89 | 29,563,202,500 | 2,161,797,500 | 2,161,855,937.5 | 58,437.5 | 6 | 3077 |
| 1 | 90 | 29,563,905,000 | 2,161,095,000 | 2,161,153,437.5 | 58,437.5 | 6 | 3076 |
| 1 | 91 | 29,564,607,500 | 2,160,392,500 | 2,160,450,937.5 | 58,437.5 | 6 | 3075 |
| 1 | 92 | 29,565,310,000 | 2,159,690,000 | 2,159,748,437.5 | 58,437.5 | 6 | 3074 |
| 1 | 93 | 29,566,012,500 | 2,158,987,500 | 2,159,045,937.5 | 58,437.5 | 6 | 3073 |
| 1 | 94 | 29,566,715,000 | 2,158,285,000 | 2,158,343,437.5 | 58,437.5 | 6 | 3072 |
| 1 | 95 | 29,567,417,500 | 2,157,582,500 | 2,157,640,937.5 | 58,437.5 | 6 | 3071 |
| 1 | 96 | 29,568,120,000 | 2,156,880,000 | 2,156,938,437.5 | 58,437.5 | 6 | 3070 |
| 1 | 97 | 29,568,822,500 | 2,156,177,500 | 2,156,235,937.5 | 58,437.5 | 6 | 3069 |
| 1 | 98 | 29,569,525,000 | 2,155,475,000 | 2,155,533,437.5 | 58,437.5 | 6 | 3068 |
| 1 | 99 | 29,570,227,500 | 2,154,772,500 | 2,154,830,937.5 | 58,437.5 | 6 | 3067 |
| 1 | 100 | 29,570,930,000 | 2,154,070,000 | 2,154,128,437.5 | 58,437.5 | 6 | 3066 |
| 1 | 101 | 29,571,632,500 | 2,153,367,500 | 2,153,425,937.5 | 58,437.5 | 6 | 3065 |
| 1 | 102 | 29,572,335,000 | 2,152,665,000 | 2,152,723,437.5 | 58,437.5 | 6 | 3064 |
| 1 | 103 | 29,573,037,500 | 2,151,962,500 | 2,152,020,937.5 | 58,437.5 | 6 | 3063 |
| 1 | 104 | 29,573,740,000 | 2,151,260,000 | 2,151,318,437.5 | 58,437.5 | 6 | 3062 |
| 1 | 105 | 29,574,442,500 | 2,150,557,500 | 2,150,615,937.5 | 58,437.5 | 6 | 3061 |
| 1 | 106 | 29,575,145,000 | 2,149,855,000 | 2,149,913,437.5 | 58,437.5 | 6 | 3060 |
| 1 | 107 | 29,575,847,500 | 2,149,152,500 | 2,149,210,937.5 | 58,437.5 | 6 | 3059 |
| 1 | 108 | 29,576,550,000 | 2,148,450,000 | 2,148,508,437.5 | 58,437.5 | 6 | 3058 |
| 1 | 109 | 29,577,252,500 | 2,147,747,500 | 2,147,805,937.5 | 58,437.5 | 6 | 3057 |
| 1 | 110 | 29,577,955,000 | 2,147,045,000 | 2,147,103,437.5 | 58,437.5 | 6 | 3056 |
| 1 | 111 | 29,578,657,500 | 2,146,342,500 | 2,146,400,937.5 | 58,437.5 | 6 | 3055 |
| 1 | 112 | 29,579,360,000 | 2,145,640,000 | 2,145,698,437.5 | 58,437.5 | 6 | 3054 |
| 1 | 113 | 29,580,062,500 | 2,144,937,500 | 2,144,995,937.5 | 58,437.5 | 6 | 3053 |
| 1 | 114 | 29,580,765,000 | 2,144,235,000 | 2,144,293,437.5 | 58,437.5 | 6 | 3052 |
| 1 | 115 | 29,581,467,500 | 2,143,532,500 | 2,143,590,937.5 | 58,437.5 | 6 | 3051 |
| 1 | 116 | 29,582,170,000 | 2,142,830,000 | 2,142,888,437.5 | 58,437.5 | 6 | 3050 |
| 1 | 117 | 29,582,872,500 | 2,142,127,500 | 2,142,185,937.5 | 58,437.5 | 6 | 3049 |
| 1 | 118 | 29,583,575,000 | 2,141,425,000 | 2,141,483,437.5 | 58,437.5 | 6 | 3048 |
| 1 | 119 | 29,584,277,500 | 2,140,722,500 | 2,140,780,937.5 | 58,437.5 | 6 | 3047 |

TABLE 2-continued

Tuning Commands for Class A - Band 1

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 1 | 120 | 29,584,980,000 | 2,140,020,000 | 2,140,078,437.5 | 58,437.5 | 6 | 3046 |
| 1 | 121 | 29,585,682,500 | 2,139,317,500 | 2,139,375,937.5 | 58,437.5 | 6 | 3045 |
| 1 | 122 | 29,586,385,000 | 2,138,615,000 | 2,138,673,437.5 | 58,437.5 | 6 | 3044 |
| 1 | 123 | 29,587,087,500 | 2,137,912,500 | 2,137,970,937.5 | 58,437.5 | 6 | 3043 |
| 1 | 124 | 29,587,790,000 | 2,137,210,000 | 2,137,268,437.5 | 58,437.5 | 6 | 3042 |
| 1 | 125 | 29,588,492,500 | 2,136,507,500 | 2,136,565,937.5 | 58,437.5 | 6 | 3041 |
| 1 | 126 | 29,589,195,000 | 2,135,805,000 | 2,135,863,437.5 | 58,437.5 | 6 | 3040 |
| 1 | 127 | 29,589,897,500 | 2,135,102,500 | 2,135,160,937.5 | 58,437.5 | 6 | 3039 |
| 1 | 128 | 29,590,600,000 | 2,134,400,000 | 2,134,458,437.5 | 58,437.5 | 6 | 3038 |
| 1 | 129 | 29,591,302,500 | 2,133,697,500 | 2,133,755,937.5 | 58,437.5 | 6 | 3037 |
| 1 | 130 | 29,592,005,000 | 2,132,995,000 | 2,133,053,437.5 | 58,437.5 | 6 | 3036 |
| 1 | 131 | 29,592,707,500 | 2,132,292,500 | 2,132,350,937.5 | 58,437.5 | 6 | 3035 |
| 1 | 132 | 29,593,410,000 | 2,131,590,000 | 2,131,648,437.5 | 58,437.5 | 6 | 3034 |
| 1 | 133 | 29,594,112,500 | 2,130,887,500 | 2,130,945,937.5 | 58,437.5 | 6 | 3033 |
| 1 | 134 | 29,594,815,000 | 2,130,185,000 | 2,130,243,437.5 | 58,437.5 | 6 | 3032 |
| 1 | 135 | 29,595,517,500 | 2,129,482,500 | 2,129,540,937.5 | 58,437.5 | 6 | 3031 |
| 1 | 136 | 29,596,220,000 | 2,128,780,000 | 2,128,838,437.5 | 58,437.5 | 6 | 3030 |
| 1 | 137 | 29,596,922,500 | 2,128,077,500 | 2,128,135,937.5 | 58,437.5 | 6 | 3029 |
| 1 | 138 | 29,597,625,000 | 2,127,375,000 | 2,127,433,437.5 | 58,437.5 | 6 | 3028 |
| 1 | 139 | 29,598,327,500 | 2,126,672,500 | 2,126,730,937.5 | 58,437.5 | 6 | 3027 |
| 1 | 140 | 29,599,030,000 | 2,125,970,000 | 2,126,028,437.5 | 58,437.5 | 6 | 3026 |
| 1 | 141 | 29,599,732,500 | 2,125,267,500 | 2,125,325,937.5 | 58,437.5 | 6 | 3025 |
| 1 | 142 | 29,600,435,000 | 2,124,565,000 | 2,124,623,437.5 | 58,437.5 | 6 | 3024 |
| 1 | 143 | 29,601,137,500 | 2,123,862,500 | 2,123,920,937.5 | 58,437.5 | 6 | 3023 |
| 1 | 144 | 29,601,840,000 | 2,123,160,000 | 2,123,218,437.5 | 58,437.5 | 6 | 3022 |
| 1 | 145 | 29,602,542,500 | 2,122,457,500 | 2,122,515,937.5 | 58,437.5 | 6 | 3021 |
| 1 | 146 | 29,603,245,000 | 2,121,755,000 | 2,121,813,437.5 | 58,437.5 | 6 | 3020 |
| 1 | 147 | 29,603,947,500 | 2,121,052,500 | 2,121,110,937.5 | 58,437.5 | 6 | 3019 |
| 1 | 148 | 29,604,650,000 | 2,120,350,000 | 2,120,408,437.5 | 58,437.5 | 6 | 3018 |
| 1 | 149 | 29,605,352,500 | 2,119,647,500 | 2,119,705,937.5 | 58,437.5 | 6 | 3017 |
| 1 | 150 | 29,606,055,000 | 2,118,945,000 | 2,119,003,437.5 | 58,437.5 | 6 | 3016 |
| 1 | 151 | 29,606,757,500 | 2,118,242,500 | 2,118,300,937.5 | 58,437.5 | 6 | 3015 |
| 1 | 152 | 29,607,460,000 | 2,117,540,000 | 2,117,598,437.5 | 58,437.5 | 6 | 3014 |
| 1 | 153 | 29,608,162,500 | 2,116,837,500 | 2,116,895,937.5 | 58,437.5 | 6 | 3013 |
| 1 | 154 | 29,608,865,000 | 2,116,135,000 | 2,116,193,437.5 | 58,437.5 | 6 | 3012 |
| 1 | 155 | 29,609,567,500 | 2,115,432,500 | 2,115,490,937.5 | 58,437.5 | 6 | 3011 |
| 1 | 156 | 29,610,270,000 | 2,114,730,000 | 2,114,788,437.5 | 58,437.5 | 6 | 3010 |
| 1 | 157 | 29,610,972,500 | 2,114,027,500 | 2,114,085,937.5 | 58,437.5 | 6 | 3009 |
| 1 | 158 | 29,611,675,000 | 2,113,325,000 | 2,113,383,437.5 | 58,437.5 | 6 | 3008 |
| 1 | 159 | 29,612,377,500 | 2,112,622,500 | 2,112,680,937.5 | 58,437.5 | 6 | 3007 |
| 1 | 160 | 29,613,080,000 | 2,111,920,000 | 2,111,978,437.5 | 58,437.5 | 6 | 3006 |
| 1 | 161 | 29,613,782,500 | 2,111,217,500 | 2,111,275,937.5 | 58,437.5 | 6 | 3005 |
| 1 | 162 | 29,614,485,000 | 2,110,515,000 | 2,110,573,437.5 | 58,437.5 | 6 | 3004 |
| 1 | 163 | 29,615,187,500 | 2,109,812,500 | 2,109,870,937.5 | 58,437.5 | 6 | 3003 |
| 1 | 164 | 29,615,890,000 | 2,109,110,000 | 2,109,168,437.5 | 58,437.5 | 6 | 3002 |
| 1 | 165 | 29,616,592,500 | 2,108,407,500 | 2,108,465,937.5 | 58,437.5 | 6 | 3001 |
| 1 | 166 | 29,617,295,000 | 2,107,705,000 | 2,107,763,437.5 | 58,437.5 | 6 | 3000 |
| 1 | 167 | 29,617,997,500 | 2,107,002,500 | 2,107,060,937.5 | 58,437.5 | 6 | 2999 |
| 1 | 168 | 29,618,700,000 | 2,106,300,000 | 2,106,358,437.5 | 58,437.5 | 6 | 2998 |
| 1 | 169 | 29,619,402,500 | 2,105,597,500 | 2,105,655,937.5 | 58,437.5 | 6 | 2997 |
| 1 | 170 | 29,620,105,000 | 2,104,895,000 | 2,104,953,437.5 | 58,437.5 | 6 | 2996 |
| 1 | 171 | 29,620,807,500 | 2,104,192,500 | 2,104,250,937.5 | 58,437.5 | 6 | 2995 |
| 1 | 172 | 29,621,510,000 | 2,103,490,000 | 2,103,548,437.5 | 58,437.5 | 6 | 2994 |
| 1 | 173 | 29,622,212,500 | 2,102,787,500 | 2,102,845,937.5 | 58,437.5 | 6 | 2993 |
| 1 | 174 | 29,622,915,000 | 2,102,085,000 | 2,102,143,437.5 | 58,437.5 | 6 | 2992 |
| 1 | 175 | 29,623,617,500 | 2,101,382,500 | 2,101,440,937.5 | 58,437.5 | 6 | 2991 |

TABLE 3

Tuning Commands for Class A - Band 2

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 2 | 1 | 29,626,382,500 | 2,098,617,500 | 2,098,630,937.5 | 13,437.5 | 6 | 2987 |
| 2 | 2 | 29,627,085,000 | 2,097,915,000 | 2,097,928,437.5 | 13,437.5 | 6 | 2986 |
| 2 | 3 | 29,627,787,500 | 2,097,212,500 | 2,097,225,937.5 | 13,437.5 | 6 | 2985 |

TABLE 3-continued

Tuning Commands for Class A - Band 2

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 2 | 4 | 29,628,490,000 | 2,096,510,000 | 2,096,523,437.5 | 13,437.5 | 6 | 2984 |
| 2 | 5 | 29,629,192,500 | 2,095,807,500 | 2,095,820,937.5 | 13,437.5 | 6 | 2983 |
| 2 | 6 | 29,629,895,000 | 2,095,105,000 | 2,095,118,437.5 | 13,437.5 | 6 | 2982 |
| 2 | 7 | 29,630,597,500 | 2,094,402,500 | 2,094,415,937.5 | 13,437.5 | 6 | 2981 |
| 2 | 8 | 29,631,300,000 | 2,093,700,000 | 2,093,713,437.5 | 13,437.5 | 6 | 2980 |
| 2 | 9 | 29,632,002,500 | 2,092,997,500 | 2,093,010,937.5 | 13,437.5 | 6 | 2979 |
| 2 | 10 | 29,632,705,000 | 2,092,295,000 | 2,092,308,437.5 | 13,437.5 | 6 | 2978 |
| 2 | 11 | 29,633,407,500 | 2,091,592,500 | 2,091,605,937.5 | 13,437.5 | 6 | 2977 |
| 2 | 12 | 29,634,110,000 | 2,090,890,000 | 2,090,903,437.5 | 13,437.5 | 6 | 2976 |
| 2 | 13 | 29,634,812,500 | 2,090,187,500 | 2,090,200,937.5 | 13,437.5 | 6 | 2975 |
| 2 | 14 | 29,635,515,000 | 2,089,485,000 | 2,089,498,437.5 | 13,437.5 | 6 | 2974 |
| 2 | 15 | 29,636,217,500 | 2,088,782,500 | 2,088,795,937.5 | 13,437.5 | 6 | 2973 |
| 2 | 16 | 29,636,920,000 | 2,088,080,000 | 2,088,093,437.5 | 13,437.5 | 6 | 2972 |
| 2 | 17 | 29,637,622,500 | 2,087,377,500 | 2,087,390,937.5 | 13,437.5 | 6 | 2971 |
| 2 | 18 | 29,638,325,000 | 2,086,675,000 | 2,086,688,437.5 | 13,437.5 | 6 | 2970 |
| 2 | 19 | 29,639,027,500 | 2,085,972,500 | 2,085,985,937.5 | 13,437.5 | 6 | 2969 |
| 2 | 20 | 29,639,730,000 | 2,085,270,000 | 2,085,283,437.5 | 13,437.5 | 6 | 2968 |
| 2 | 21 | 29,640,432,500 | 2,084,567,500 | 2,084,580,937.5 | 13,437.5 | 6 | 2967 |
| 2 | 22 | 29,641,135,000 | 2,083,865,000 | 2,083,878,437.5 | 13,437.5 | 6 | 2966 |
| 2 | 23 | 29,641,837,500 | 2,083,162,500 | 2,083,175,937.5 | 13,437.5 | 6 | 2965 |
| 2 | 24 | 29,642,540,000 | 2,082,460,000 | 2,082,473,437.5 | 13,437.5 | 6 | 2964 |
| 2 | 25 | 29,643,242,500 | 2,081,757,500 | 2,081,770,937.5 | 13,437.5 | 6 | 2963 |
| 2 | 26 | 29,643,945,000 | 2,081,055,000 | 2,081,068,437.5 | 13,437.5 | 6 | 2962 |
| 2 | 27 | 29,644,647,500 | 2,080,352,500 | 2,080,365,937.5 | 13,437.5 | 6 | 2961 |
| 2 | 28 | 29,645,350,000 | 2,079,650,000 | 2,079,663,437.5 | 13,437.5 | 6 | 2960 |
| 2 | 29 | 29,646,052,500 | 2,078,947,500 | 2,078,960,937.5 | 13,437.5 | 6 | 2959 |
| 2 | 30 | 29,646,755,000 | 2,078,245,000 | 2,078,258,437.5 | 13,437.5 | 6 | 2958 |
| 2 | 31 | 29,647,457,500 | 2,077,542,500 | 2,077,555,937.5 | 13,437.5 | 6 | 2957 |
| 2 | 32 | 29,648,160,000 | 2,076,840,000 | 2,076,853,437.5 | 13,437.5 | 6 | 2956 |
| 2 | 33 | 29,648,862,500 | 2,076,137,500 | 2,076,150,937.5 | 13,437.5 | 6 | 2955 |
| 2 | 34 | 29,649,565,000 | 2,075,435,000 | 2,075,448,437.5 | 13,437.5 | 6 | 2954 |
| 2 | 35 | 29,650,267,500 | 2,074,732,500 | 2,074,745,937.5 | 13,437.5 | 6 | 2953 |
| 2 | 36 | 29,650,970,000 | 2,074,030,000 | 2,074,043,437.5 | 13,437.5 | 6 | 2952 |
| 2 | 37 | 29,651,672,500 | 2,073,327,500 | 2,073,340,937.5 | 13,437.5 | 6 | 2951 |
| 2 | 38 | 29,652,375,000 | 2,072,625,000 | 2,072,638,437.5 | 13,437.5 | 6 | 2950 |
| 2 | 39 | 29,653,077,500 | 2,071,922,500 | 2,071,935,937.5 | 13,437.5 | 6 | 2949 |
| 2 | 40 | 29,653,780,000 | 2,071,220,000 | 2,071,233,437.5 | 13,437.5 | 6 | 2948 |
| 2 | 41 | 29,654,482,500 | 2,070,517,500 | 2,070,530,937.5 | 13,437.5 | 6 | 2947 |
| 2 | 42 | 29,655,185,000 | 2,069,815,000 | 2,069,828,437.5 | 13,437.5 | 6 | 2946 |
| 2 | 43 | 29,655,887,500 | 2,069,112,500 | 2,069,125,937.5 | 13,437.5 | 6 | 2945 |
| 2 | 44 | 29,656,590,000 | 2,068,410,000 | 2,068,423,437.5 | 13,437.5 | 6 | 2944 |
| 2 | 45 | 29,657,292,500 | 2,067,707,500 | 2,067,720,937.5 | 13,437.5 | 6 | 2943 |
| 2 | 46 | 29,657,995,000 | 2,067,005,000 | 2,067,018,437.5 | 13,437.5 | 6 | 2942 |
| 2 | 47 | 29,658,697,500 | 2,066,302,500 | 2,066,315,937.5 | 13,437.5 | 6 | 2941 |
| 2 | 48 | 29,659,400,000 | 2,065,600,000 | 2,065,613,437.5 | 13,437.5 | 6 | 2940 |
| 2 | 49 | 29,660,102,500 | 2,064,897,500 | 2,064,910,937.5 | 13,437.5 | 6 | 2939 |
| 2 | 50 | 29,660,805,000 | 2,064,195,000 | 2,064,208,437.5 | 13,437.5 | 6 | 2938 |
| 2 | 51 | 29,661,507,500 | 2,063,492,500 | 2,063,505,937.5 | 13,437.5 | 6 | 2937 |
| 2 | 52 | 29,662,210,000 | 2,062,790,000 | 2,062,803,437.5 | 13,437.5 | 6 | 2936 |
| 2 | 53 | 29,662,912,500 | 2,062,087,500 | 2,062,100,937.5 | 13,437.5 | 6 | 2935 |
| 2 | 54 | 29,663,615,000 | 2,061,385,000 | 2,061,398,437.5 | 13,437.5 | 6 | 2934 |
| 2 | 55 | 29,664,317,500 | 2,060,682,500 | 2,060,695,937.5 | 13,437.5 | 6 | 2933 |
| 2 | 56 | 29,665,020,000 | 2,059,980,000 | 2,059,993,437.5 | 13,437.5 | 6 | 2932 |
| 2 | 57 | 29,665,722,500 | 2,059,277,500 | 2,059,290,937.5 | 13,437.5 | 6 | 2931 |
| 2 | 58 | 29,666,425,000 | 2,058,575,000 | 2,058,588,437.5 | 13,437.5 | 6 | 2930 |
| 2 | 59 | 29,667,127,500 | 2,057,872,500 | 2,057,885,937.5 | 13,437.5 | 6 | 2929 |
| 2 | 60 | 29,667,830,000 | 2,057,170,000 | 2,057,183,437.5 | 13,437.5 | 6 | 2928 |
| 2 | 61 | 29,668,532,500 | 2,056,467,500 | 2,056,480,937.5 | 13,437.5 | 6 | 2927 |
| 2 | 62 | 29,669,235,000 | 2,055,765,000 | 2,055,778,437.5 | 13,437.5 | 6 | 2926 |
| 2 | 63 | 29,669,937,500 | 2,055,062,500 | 2,055,075,937.5 | 13,437.5 | 6 | 2925 |
| 2 | 64 | 29,670,640,000 | 2,054,360,000 | 2,054,373,437.5 | 13,437.5 | 6 | 2924 |
| 2 | 65 | 29,671,342,500 | 2,053,657,500 | 2,053,670,937.5 | 13,437.5 | 6 | 2923 |
| 2 | 66 | 29,672,045,000 | 2,052,955,000 | 2,052,968,437.5 | 13,437.5 | 6 | 2922 |
| 2 | 67 | 29,672,747,500 | 2,052,252,500 | 2,052,265,937.5 | 13,437.5 | 6 | 2921 |
| 2 | 68 | 29,673,450,000 | 2,051,550,000 | 2,051,563,437.5 | 13,437.5 | 6 | 2920 |
| 2 | 69 | 29,674,152,500 | 2,050,847,500 | 2,050,860,937.5 | 13,437.5 | 6 | 2919 |
| 2 | 70 | 29,674,855,000 | 2,050,145,000 | 2,050,158,437.5 | 13,437.5 | 6 | 2918 |
| 2 | 71 | 29,675,557,500 | 2,049,442,500 | 2,049,455,937.5 | 13,437.5 | 6 | 2917 |
| 2 | 72 | 29,676,260,000 | 2,048,740,000 | 2,048,753,437.5 | 13,437.5 | 6 | 2916 |
| 2 | 73 | 29,676,962,500 | 2,048,037,500 | 2,048,050,937.5 | 13,437.5 | 6 | 2915 |
| 2 | 74 | 29,677,665,000 | 2,047,335,000 | 2,047,348,437.5 | 13,437.5 | 6 | 2914 |
| 2 | 75 | 29,678,367,500 | 2,046,632,500 | 2,046,645,937.5 | 13,437.5 | 6 | 2913 |

TABLE 3-continued

Tuning Commands for Class A - Band 2

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 2 | 76 | 29,679,070,000 | 2,045,930,000 | 2,045,943,437.5 | 13,437.5 | 6 | 2912 |
| 2 | 77 | 29,679,772,500 | 2,045,227,500 | 2,045,240,937.5 | 13,437.5 | 6 | 2911 |
| 2 | 78 | 29,680,475,000 | 2,044,525,000 | 2,044,538,437.5 | 13,437.5 | 6 | 2910 |
| 2 | 79 | 29,681,177,500 | 2,043,822,500 | 2,043,835,937.5 | 13,437.5 | 6 | 2909 |
| 2 | 80 | 29,681,880,000 | 2,043,120,000 | 2,043,133,437.5 | 13,437.5 | 6 | 2908 |
| 2 | 81 | 29,682,582,500 | 2,042,417,500 | 2,042,430,937.5 | 13,437.5 | 6 | 2907 |
| 2 | 82 | 29,683,285,000 | 2,041,715,000 | 2,041,728,437.5 | 13,437.5 | 6 | 2906 |
| 2 | 83 | 29,683,987,500 | 2,041,012,500 | 2,041,025,937.5 | 13,437.5 | 6 | 2905 |
| 2 | 84 | 29,684,690,000 | 2,040,310,000 | 2,040,323,437.5 | 13,437.5 | 6 | 2904 |
| 2 | 85 | 29,685,392,500 | 2,039,607,500 | 2,039,620,937.5 | 13,437.5 | 6 | 2903 |
| 2 | 86 | 29,686,095,000 | 2,038,905,000 | 2,038,918,437.5 | 13,437.5 | 6 | 2902 |
| 2 | 87 | 29,686,797,500 | 2,038,202,500 | 2,038,215,937.5 | 13,437.5 | 6 | 2901 |
| 2 | 88 | 29,687,500,000 | 2,037,500,000 | 2,037,513,437.5 | 13,437.5 | 6 | 2900 |
| 2 | 89 | 29,688,202,500 | 2,036,797,500 | 2,036,810,937.5 | 13,437.5 | 6 | 2899 |
| 2 | 90 | 29,688,905,000 | 2,036,095,000 | 2,036,108,437.5 | 13,437.5 | 6 | 2898 |
| 2 | 91 | 29,689,607,500 | 2,035,392,500 | 2,035,405,937.5 | 13,437.5 | 6 | 2897 |
| 2 | 92 | 29,690,310,000 | 2,034,690,000 | 2,034,703,437.5 | 13,437.5 | 6 | 2896 |
| 2 | 93 | 29,691,012,500 | 2,033,987,500 | 2,034,000,937.5 | 13,437.5 | 6 | 2895 |
| 2 | 94 | 29,691,715,000 | 2,033,285,000 | 2,033,298,437.5 | 13,437.5 | 6 | 2894 |
| 2 | 95 | 29,692,417,500 | 2,032,582,500 | 2,032,595,937.5 | 13,437.5 | 6 | 2893 |
| 2 | 96 | 29,693,120,000 | 2,031,880,000 | 2,031,893,437.5 | 13,437.5 | 6 | 2892 |
| 2 | 97 | 29,693,822,500 | 2,031,177,500 | 2,031,190,937.5 | 13,437.5 | 6 | 2891 |
| 2 | 98 | 29,694,525,000 | 2,030,475,000 | 2,030,488,437.5 | 13,437.5 | 6 | 2890 |
| 2 | 99 | 29,695,227,500 | 2,029,772,500 | 2,029,785,937.5 | 13,437.5 | 6 | 2889 |
| 2 | 100 | 29,695,930,000 | 2,029,070,000 | 2,029,083,437.5 | 13,437.5 | 6 | 2888 |
| 2 | 101 | 29,696,632,500 | 2,028,367,500 | 2,028,380,937.5 | 13,437.5 | 6 | 2887 |
| 2 | 102 | 29,697,335,000 | 2,027,665,000 | 2,027,678,437.5 | 13,437.5 | 6 | 2886 |
| 2 | 103 | 29,698,037,500 | 2,026,962,500 | 2,026,975,937.5 | 13,437.5 | 6 | 2885 |
| 2 | 104 | 29,698,740,000 | 2,026,260,000 | 2,026,273,437.5 | 13,437.5 | 6 | 2884 |
| 2 | 105 | 29,699,442,500 | 2,025,557,500 | 2,025,570,937.5 | 13,437.5 | 6 | 2883 |
| 2 | 106 | 29,700,145,000 | 2,024,855,000 | 2,024,868,437.5 | 13,437.5 | 6 | 2882 |
| 2 | 107 | 29,700,847,500 | 2,024,152,500 | 2,024,165,937.5 | 13,437.5 | 6 | 2881 |
| 2 | 108 | 29,701,550,000 | 2,023,450,000 | 2,023,463,437.5 | 13,437.5 | 6 | 2880 |
| 2 | 109 | 29,702,252,500 | 2,022,747,500 | 2,022,760,937.5 | 13,437.5 | 6 | 2879 |
| 2 | 110 | 29,702,955,000 | 2,022,045,000 | 2,022,058,437.5 | 13,437.5 | 6 | 2878 |
| 2 | 111 | 29,703,657,500 | 2,021,342,500 | 2,021,355,937.5 | 13,437.5 | 6 | 2877 |
| 2 | 112 | 29,704,360,000 | 2,020,640,000 | 2,020,653,437.5 | 13,437.5 | 6 | 2876 |
| 2 | 113 | 29,705,062,500 | 2,019,937,500 | 2,019,950,937.5 | 13,437.5 | 6 | 2875 |
| 2 | 114 | 29,705,765,000 | 2,019,235,000 | 2,019,248,437.5 | 13,437.5 | 6 | 2874 |
| 2 | 115 | 29,706,467,500 | 2,018,532,500 | 2,018,545,937.5 | 13,437.5 | 6 | 2873 |
| 2 | 116 | 29,707,170,000 | 2,017,830,000 | 2,017,843,437.5 | 13,437.5 | 6 | 2872 |
| 2 | 117 | 29,707,872,500 | 2,017,127,500 | 2,017,140,937.5 | 13,437.5 | 6 | 2871 |
| 2 | 118 | 29,708,575,000 | 2,016,425,000 | 2,016,438,437.5 | 13,437.5 | 6 | 2870 |
| 2 | 119 | 29,709,277,500 | 2,015,722,500 | 2,015,735,937.5 | 13,437.5 | 6 | 2869 |
| 2 | 120 | 29,709,980,000 | 2,015,020,000 | 2,015,033,437.5 | 13,437.5 | 6 | 2868 |
| 2 | 121 | 29,710,682,500 | 2,014,317,500 | 2,014,330,937.5 | 13,437.5 | 6 | 2867 |
| 2 | 122 | 29,711,385,000 | 2,013,615,000 | 2,013,628,437.5 | 13,437.5 | 6 | 2866 |
| 2 | 123 | 29,712,087,500 | 2,012,912,500 | 2,012,925,937.5 | 13,437.5 | 6 | 2865 |
| 2 | 124 | 29,712,790,000 | 2,012,210,000 | 2,012,223,437.5 | 13,437.5 | 6 | 2864 |
| 2 | 125 | 29,713,492,500 | 2,011,507,500 | 2,011,520,937.5 | 13,437.5 | 6 | 2863 |
| 2 | 126 | 29,714,195,000 | 2,010,805,000 | 2,010,818,437.5 | 13,437.5 | 6 | 2862 |
| 2 | 127 | 29,714,897,500 | 2,010,102,500 | 2,010,115,937.5 | 13,437.5 | 6 | 2861 |
| 2 | 128 | 29,715,600,000 | 2,009,400,000 | 2,009,413,437.5 | 13,437.5 | 6 | 2860 |
| 2 | 129 | 29,716,302,500 | 2,008,697,500 | 2,008,710,937.5 | 13,437.5 | 6 | 2859 |
| 2 | 130 | 29,717,005,000 | 2,007,995,000 | 2,008,008,437.5 | 13,437.5 | 6 | 2858 |
| 2 | 131 | 29,717,707,500 | 2,007,292,500 | 2,007,305,937.5 | 13,437.5 | 6 | 2857 |
| 2 | 132 | 29,718,410,000 | 2,006,590,000 | 2,006,603,437.5 | 13,437.5 | 6 | 2856 |
| 2 | 133 | 29,719,112,500 | 2,005,887,500 | 2,005,900,937.5 | 13,437.5 | 6 | 2855 |
| 2 | 134 | 29,719,815,000 | 2,005,185,000 | 2,005,198,437.5 | 13,437.5 | 6 | 2854 |
| 2 | 135 | 29,720,517,500 | 2,004,482,500 | 2,004,495,937.5 | 13,437.5 | 6 | 2853 |
| 2 | 136 | 29,721,220,000 | 2,003,780,000 | 2,003,793,437.5 | 13,437.5 | 6 | 2852 |
| 2 | 137 | 29,721,922,500 | 2,003,077,500 | 2,003,090,937.5 | 13,437.5 | 6 | 2851 |
| 2 | 138 | 29,722,625,000 | 2,002,375,000 | 2,002,388,437.5 | 13,437.5 | 6 | 2850 |
| 2 | 139 | 29,723,327,500 | 2,001,672,500 | 2,001,685,937.5 | 13,437.5 | 6 | 2849 |
| 2 | 140 | 29,724,030,000 | 2,000,970,000 | 2,000,983,437.5 | 13,437.5 | 6 | 2848 |
| 2 | 141 | 29,724,732,500 | 2,000,267,500 | 2,000,280,937.5 | 13,437.5 | 6 | 2847 |
| 2 | 142 | 29,725,435,000 | 1,999,565,000 | 1,999,578,437.5 | 13,437.5 | 6 | 2846 |
| 2 | 143 | 29,726,137,500 | 1,998,862,500 | 1,998,875,937.5 | 13,437.5 | 6 | 2845 |
| 2 | 144 | 29,726,840,000 | 1,998,160,000 | 1,998,173,437.5 | 13,437.5 | 6 | 2844 |
| 2 | 145 | 29,727,542,500 | 1,997,457,500 | 1,997,470,937.5 | 13,437.5 | 6 | 2843 |
| 2 | 146 | 29,728,245,000 | 1,996,755,000 | 1,996,768,437.5 | 13,437.5 | 6 | 2842 |
| 2 | 147 | 29,728,947,500 | 1,996,052,500 | 1,996,065,937.5 | 13,437.5 | 6 | 2841 |

TABLE 3-continued

Tuning Commands for Class A - Band 2

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 2 | 148 | 29,729,650,000 | 1,995,350,000 | 1,995,363,437.5 | 13,437.5 | 6 | 2840 |
| 2 | 149 | 29,730,352,500 | 1,994,647,500 | 1,994,660,937.5 | 13,437.5 | 6 | 2839 |
| 2 | 150 | 29,731,055,000 | 1,993,945,000 | 1,993,958,437.5 | 13,437.5 | 6 | 2838 |
| 2 | 151 | 29,731,757,500 | 1,993,242,500 | 1,993,255,937.5 | 13,437.5 | 6 | 2837 |
| 2 | 152 | 29,732,460,000 | 1,992,540,000 | 1,992,553,437.5 | 13,437.5 | 6 | 2836 |
| 2 | 153 | 29,733,162,500 | 1,991,837,500 | 1,991,850,937.5 | 13,437.5 | 6 | 2835 |
| 2 | 154 | 29,733,865,000 | 1,991,135,000 | 1,991,148,437.5 | 13,437.5 | 6 | 2834 |
| 2 | 155 | 29,734,567,500 | 1,990,432,500 | 1,990,445,937.5 | 13,437.5 | 6 | 2833 |
| 2 | 156 | 29,735,270,000 | 1,989,730,000 | 1,989,743,437.5 | 13,437.5 | 6 | 2832 |
| 2 | 157 | 29,735,972,500 | 1,989,027,500 | 1,989,040,937.5 | 13,437.5 | 6 | 2831 |
| 2 | 158 | 29,736,675,000 | 1,988,325,000 | 1,988,338,437.5 | 13,437.5 | 6 | 2830 |
| 2 | 159 | 29,737,377,500 | 1,987,622,500 | 1,987,635,937.5 | 13,437.5 | 6 | 2829 |
| 2 | 160 | 29,738,080,000 | 1,986,920,000 | 1,986,933,437.5 | 13,437.5 | 6 | 2828 |
| 2 | 161 | 29,738,782,500 | 1,986,217,500 | 1,986,230,937.5 | 13,437.5 | 6 | 2827 |
| 2 | 162 | 29,739,485,000 | 1,985,515,000 | 1,985,528,437.5 | 13,437.5 | 6 | 2826 |
| 2 | 163 | 29,740,187,500 | 1,984,812,500 | 1,984,825,937.5 | 13,437.5 | 6 | 2825 |
| 2 | 164 | 29,740,890,000 | 1,984,110,000 | 1,984,123,437.5 | 13,437.5 | 6 | 2824 |
| 2 | 165 | 29,741,592,500 | 1,983,407,500 | 1,983,420,937.5 | 13,437.5 | 6 | 2823 |
| 2 | 166 | 29,742,295,000 | 1,982,705,000 | 1,982,718,437.5 | 13,437.5 | 6 | 2822 |
| 2 | 167 | 29,742,997,500 | 1,982,002,500 | 1,982,015,937.5 | 13,437.5 | 6 | 2821 |
| 2 | 168 | 29,743,700,000 | 1,981,300,000 | 1,981,313,437.5 | 13,437.5 | 6 | 2820 |
| 2 | 169 | 29,744,402,500 | 1,980,597,500 | 1,980,610,937.5 | 13,437.5 | 6 | 2819 |
| 2 | 170 | 29,745,105,000 | 1,979,895,000 | 1,979,908,437.5 | 13,437.5 | 6 | 2818 |
| 2 | 171 | 29,745,807,500 | 1,979,192,500 | 1,979,205,937.5 | 13,437.5 | 6 | 2817 |
| 2 | 172 | 29,746,510,000 | 1,978,490,000 | 1,978,503,437.5 | 13,437.5 | 6 | 2816 |
| 2 | 173 | 29,747,212,500 | 1,977,787,500 | 1,977,800,937.5 | 13,437.5 | 6 | 2815 |
| 2 | 174 | 29,747,915,000 | 1,977,085,000 | 1,977,098,437.5 | 13,437.5 | 6 | 2814 |
| 2 | 175 | 29,748,617,500 | 1,976,382,500 | 1,976,395,937.5 | 13,437.5 | 6 | 2813 |

TABLE 4

Tuning Commands for Class A - Band 3

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 3 | 1 | 29,751,382,500 | 1,973,617,500 | 1,973,673,750.0 | 56,250.0 | 8 | 2809 |
| 3 | 2 | 29,752,085,000 | 1,972,915,000 | 1,972,971,250.0 | 56,250.0 | 8 | 2808 |
| 3 | 3 | 29,752,787,500 | 1,972,212,500 | 1,972,268,750.0 | 56,250.0 | 8 | 2807 |
| 3 | 4 | 29,753,490,000 | 1,971,510,000 | 1,971,566,250.0 | 56,250.0 | 8 | 2806 |
| 3 | 5 | 29,754,192,500 | 1,970,807,500 | 1,970,863,750.0 | 56,250.0 | 8 | 2805 |
| 3 | 6 | 29,754,895,000 | 1,970,105,000 | 1,970,161,250.0 | 56,250.0 | 8 | 2804 |
| 3 | 7 | 29,755,597,500 | 1,969,402,500 | 1,969,458,750.0 | 56,250.0 | 8 | 2803 |
| 3 | 8 | 29,756,300,000 | 1,968,700,000 | 1,968,756,250.0 | 56,250.0 | 8 | 2802 |
| 3 | 9 | 29,757,002,500 | 1,967,997,500 | 1,968,053,750.0 | 56,250.0 | 8 | 2801 |
| 3 | 10 | 29,757,705,000 | 1,967,295,000 | 1,967,351,250.0 | 56,250.0 | 8 | 2800 |
| 3 | 11 | 29,758,407,500 | 1,966,592,500 | 1,966,648,750.0 | 56,250.0 | 8 | 2799 |
| 3 | 12 | 29,759,110,000 | 1,965,890,000 | 1,965,946,250.0 | 56,250.0 | 8 | 2798 |
| 3 | 13 | 29,759,812,500 | 1,965,187,500 | 1,965,243,750.0 | 56,250.0 | 8 | 2797 |
| 3 | 14 | 29,760,515,000 | 1,964,485,000 | 1,964,541,250.0 | 56,250.0 | 8 | 2796 |
| 3 | 15 | 29,761,217,500 | 1,963,782,500 | 1,963,838,750.0 | 56,250.0 | 8 | 2795 |
| 3 | 16 | 29,761,920,000 | 1,963,080,000 | 1,963,136,250.0 | 56,250.0 | 8 | 2794 |
| 3 | 17 | 29,762,622,500 | 1,962,377,500 | 1,962,433,750.0 | 56,250.0 | 8 | 2793 |
| 3 | 18 | 29,763,325,000 | 1,961,675,000 | 1,961,731,250.0 | 56,250.0 | 8 | 2792 |
| 3 | 19 | 29,764,027,500 | 1,960,972,500 | 1,961,028,750.0 | 56,250.0 | 8 | 2791 |
| 3 | 20 | 29,764,730,000 | 1,960,270,000 | 1,960,326,250.0 | 56,250.0 | 8 | 2790 |
| 3 | 21 | 29,765,432,500 | 1,959,567,500 | 1,959,623,750.0 | 56,250.0 | 8 | 2789 |
| 3 | 22 | 29,766,135,000 | 1,958,865,000 | 1,958,921,250.0 | 56,250.0 | 8 | 2788 |
| 3 | 23 | 29,766,837,500 | 1,958,162,500 | 1,958,218,750.0 | 56,250.0 | 8 | 2787 |
| 3 | 24 | 29,767,540,000 | 1,957,460,000 | 1,957,516,250.0 | 56,250.0 | 8 | 2786 |
| 3 | 25 | 29,768,242,500 | 1,956,757,500 | 1,956,813,750.0 | 56,250.0 | 8 | 2785 |
| 3 | 26 | 29,768,945,000 | 1,956,055,000 | 1,956,111,250.0 | 56,250.0 | 8 | 2784 |
| 3 | 27 | 29,769,647,500 | 1,955,352,500 | 1,955,408,750.0 | 56,250.0 | 8 | 2783 |
| 3 | 28 | 29,770,350,000 | 1,954,650,000 | 1,954,706,250.0 | 56,250.0 | 8 | 2782 |
| 3 | 29 | 29,771,052,500 | 1,953,947,500 | 1,954,003,750.0 | 56,250.0 | 8 | 2781 |
| 3 | 30 | 29,771,755,000 | 1,953,245,000 | 1,953,301,250.0 | 56,250.0 | 8 | 2780 |
| 3 | 31 | 29,772,457,500 | 1,952,542,500 | 1,952,598,750.0 | 56,250.0 | 8 | 2779 |

TABLE 4-continued

Tuning Commands for Class A - Band 3

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 3 | 32 | 29,773,160,000 | 1,951,840,000 | 1,951,896,250.0 | 56,250.0 | 8 | 2778 |
| 3 | 33 | 29,773,862,500 | 1,951,137,500 | 1,951,193,750.0 | 56,250.0 | 8 | 2777 |
| 3 | 34 | 29,774,565,000 | 1,950,435,000 | 1,950,491,250.0 | 56,250.0 | 8 | 2776 |
| 3 | 35 | 29,775,267,500 | 1,949,732,500 | 1,949,788,750.0 | 56,250.0 | 8 | 2775 |
| 3 | 36 | 29,775,970,000 | 1,949,030,000 | 1,949,086,250.0 | 56,250.0 | 8 | 2774 |
| 3 | 37 | 29,776,672,500 | 1,948,327,500 | 1,948,383,750.0 | 56,250.0 | 8 | 2773 |
| 3 | 38 | 29,777,375,000 | 1,947,625,000 | 1,947,681,250.0 | 56,250.0 | 8 | 2772 |
| 3 | 39 | 29,778,077,500 | 1,946,922,500 | 1,946,978,750.0 | 56,250.0 | 8 | 2771 |
| 3 | 40 | 29,778,780,000 | 1,946,220,000 | 1,946,276,250.0 | 56,250.0 | 8 | 2770 |
| 3 | 41 | 29,779,482,500 | 1,945,517,500 | 1,945,573,750.0 | 56,250.0 | 8 | 2769 |
| 3 | 42 | 29,780,185,000 | 1,944,815,000 | 1,944,871,250.0 | 56,250.0 | 8 | 2768 |
| 3 | 43 | 29,780,887,500 | 1,944,112,500 | 1,944,168,750.0 | 56,250.0 | 8 | 2767 |
| 3 | 44 | 29,781,590,000 | 1,943,410,000 | 1,943,466,250.0 | 56,250.0 | 8 | 2766 |
| 3 | 45 | 29,782,292,500 | 1,942,707,500 | 1,942,763,750.0 | 56,250.0 | 8 | 2765 |
| 3 | 46 | 29,782,995,000 | 1,942,005,000 | 1,942,061,250.0 | 56,250.0 | 8 | 2764 |
| 3 | 47 | 29,783,697,500 | 1,941,302,500 | 1,941,358,750.0 | 56,250.0 | 8 | 2763 |
| 3 | 48 | 29,784,400,000 | 1,940,600,000 | 1,940,656,250.0 | 56,250.0 | 8 | 2762 |
| 3 | 49 | 29,785,102,500 | 1,939,897,500 | 1,939,953,750.0 | 56,250.0 | 8 | 2761 |
| 3 | 50 | 29,785,805,000 | 1,939,195,000 | 1,939,251,250.0 | 56,250.0 | 8 | 2760 |
| 3 | 51 | 29,786,507,500 | 1,938,492,500 | 1,938,548,750.0 | 56,250.0 | 8 | 2759 |
| 3 | 52 | 29,787,210,000 | 1,937,790,000 | 1,937,846,250.0 | 56,250.0 | 8 | 2758 |
| 3 | 53 | 29,787,912,500 | 1,937,087,500 | 1,937,143,750.0 | 56,250.0 | 8 | 2757 |
| 3 | 54 | 29,788,615,000 | 1,936,385,000 | 1,936,441,250.0 | 56,250.0 | 8 | 2756 |
| 3 | 55 | 29,789,317,500 | 1,935,682,500 | 1,935,738,750.0 | 56,250.0 | 8 | 2755 |
| 3 | 56 | 29,790,020,000 | 1,934,980,000 | 1,935,036,250.0 | 56,250.0 | 8 | 2754 |
| 3 | 57 | 29,790,722,500 | 1,934,277,500 | 1,934,333,750.0 | 56,250.0 | 8 | 2753 |
| 3 | 58 | 29,791,425,000 | 1,933,575,000 | 1,933,631,250.0 | 56,250.0 | 8 | 2752 |
| 3 | 59 | 29,792,127,500 | 1,932,872,500 | 1,932,928,750.0 | 56,250.0 | 8 | 2751 |
| 3 | 60 | 29,792,830,000 | 1,932,170,000 | 1,932,226,250.0 | 56,250.0 | 8 | 2750 |
| 3 | 61 | 29,793,532,500 | 1,931,467,500 | 1,931,523,750.0 | 56,250.0 | 8 | 2749 |
| 3 | 62 | 29,794,235,000 | 1,930,765,000 | 1,930,821,250.0 | 56,250.0 | 8 | 2748 |
| 3 | 63 | 29,794,937,500 | 1,930,062,500 | 1,930,118,750.0 | 56,250.0 | 8 | 2747 |
| 3 | 64 | 29,795,640,000 | 1,929,360,000 | 1,929,416,250.0 | 56,250.0 | 8 | 2746 |
| 3 | 65 | 29,796,342,500 | 1,928,657,500 | 1,928,713,750.0 | 56,250.0 | 8 | 2745 |
| 3 | 66 | 29,797,045,000 | 1,927,955,000 | 1,928,011,250.0 | 56,250.0 | 8 | 2744 |
| 3 | 67 | 29,797,747,500 | 1,927,252,500 | 1,927,308,750.0 | 56,250.0 | 8 | 2743 |
| 3 | 68 | 29,798,450,000 | 1,926,550,000 | 1,926,606,250.0 | 56,250.0 | 8 | 2742 |
| 3 | 69 | 29,799,152,500 | 1,925,847,500 | 1,925,903,750.0 | 56,250.0 | 8 | 2741 |
| 3 | 70 | 29,799,855,000 | 1,925,145,000 | 1,925,201,250.0 | 56,250.0 | 8 | 2740 |
| 3 | 71 | 29,800,557,500 | 1,924,442,500 | 1,924,498,750.0 | 56,250.0 | 8 | 2739 |
| 3 | 72 | 29,801,260,000 | 1,923,740,000 | 1,923,796,250.0 | 56,250.0 | 8 | 2738 |
| 3 | 73 | 29,801,962,500 | 1,923,037,500 | 1,923,093,750.0 | 56,250.0 | 8 | 2737 |
| 3 | 74 | 29,802,665,000 | 1,922,335,000 | 1,922,391,250.0 | 56,250.0 | 8 | 2736 |
| 3 | 75 | 29,803,367,500 | 1,921,632,500 | 1,921,688,750.0 | 56,250.0 | 8 | 2735 |
| 3 | 76 | 29,804,070,000 | 1,920,930,000 | 1,920,986,250.0 | 56,250.0 | 8 | 2734 |
| 3 | 77 | 29,804,772,500 | 1,920,227,500 | 1,920,283,750.0 | 56,250.0 | 8 | 2733 |
| 3 | 78 | 29,805,475,000 | 1,919,525,000 | 1,919,581,250.0 | 56,250.0 | 8 | 2732 |
| 3 | 79 | 29,806,177,500 | 1,918,822,500 | 1,918,878,750.0 | 56,250.0 | 8 | 2731 |
| 3 | 80 | 29,806,880,000 | 1,918,120,000 | 1,918,176,250.0 | 56,250.0 | 8 | 2730 |
| 3 | 81 | 29,807,582,500 | 1,917,417,500 | 1,917,473,750.0 | 56,250.0 | 8 | 2729 |
| 3 | 82 | 29,808,285,000 | 1,916,715,000 | 1,916,771,250.0 | 56,250.0 | 8 | 2728 |
| 3 | 83 | 29,808,987,500 | 1,916,012,500 | 1,916,068,750.0 | 56,250.0 | 8 | 2727 |
| 3 | 84 | 29,809,690,000 | 1,915,310,000 | 1,915,366,250.0 | 56,250.0 | 8 | 2726 |
| 3 | 85 | 29,810,392,500 | 1,914,607,500 | 1,914,663,750.0 | 56,250.0 | 8 | 2725 |
| 3 | 86 | 29,811,095,000 | 1,913,905,000 | 1,913,961,250.0 | 56,250.0 | 8 | 2724 |
| 3 | 87 | 29,811,797,500 | 1,913,202,500 | 1,913,258,750.0 | 56,250.0 | 8 | 2723 |
| 3 | 88 | 29,812,500,000 | 1,912,500,000 | 1,912,556,250.0 | 56,250.0 | 8 | 2722 |
| 3 | 89 | 29,813,202,500 | 1,911,797,500 | 1,911,853,750.0 | 56,250.0 | 8 | 2721 |
| 3 | 90 | 29,813,905,000 | 1,911,095,000 | 1,911,151,250.0 | 56,250.0 | 8 | 2720 |
| 3 | 91 | 29,814,607,500 | 1,910,392,500 | 1,910,448,750.0 | 56,250.0 | 8 | 2719 |
| 3 | 92 | 29,815,310,000 | 1,909,690,000 | 1,909,746,250.0 | 56,250.0 | 8 | 2718 |
| 3 | 93 | 29,816,012,500 | 1,908,987,500 | 1,909,043,750.0 | 56,250.0 | 8 | 2717 |
| 3 | 94 | 29,816,715,000 | 1,908,285,000 | 1,908,341,250.0 | 56,250.0 | 8 | 2716 |
| 3 | 95 | 29,817,417,500 | 1,907,582,500 | 1,907,638,750.0 | 56,250.0 | 8 | 2715 |
| 3 | 96 | 29,818,120,000 | 1,906,880,000 | 1,906,936,250.0 | 56,250.0 | 8 | 2714 |
| 3 | 97 | 29,818,822,500 | 1,906,177,500 | 1,906,233,750.0 | 56,250.0 | 8 | 2713 |
| 3 | 98 | 29,819,525,000 | 1,905,475,000 | 1,905,531,250.0 | 56,250.0 | 8 | 2712 |
| 3 | 99 | 29,820,227,500 | 1,904,772,500 | 1,904,828,750.0 | 56,250.0 | 8 | 2711 |
| 3 | 100 | 29,820,930,000 | 1,904,070,000 | 1,904,126,250.0 | 56,250.0 | 8 | 2710 |
| 3 | 101 | 29,821,632,500 | 1,903,367,500 | 1,903,423,750.0 | 56,250.0 | 8 | 2709 |
| 3 | 102 | 29,822,335,000 | 1,902,665,000 | 1,902,721,250.0 | 56,250.0 | 8 | 2708 |
| 3 | 103 | 29,823,037,500 | 1,901,962,500 | 1,902,018,750.0 | 56,250.0 | 8 | 2707 |

TABLE 4-continued

Tuning Commands for Class A - Band 3

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 3 | 104 | 29,823,740,000 | 1,901,260,000 | 1,901,316,250.0 | 56,250.0 | 8 | 2706 |
| 3 | 105 | 29,824,442,500 | 1,900,557,500 | 1,900,613,750.0 | 56,250.0 | 8 | 2705 |
| 3 | 106 | 29,825,145,000 | 1,899,855,000 | 1,899,911,250.0 | 56,250.0 | 8 | 2704 |
| 3 | 107 | 29,825,847,500 | 1,899,152,500 | 1,899,208,750.0 | 56,250.0 | 8 | 2703 |
| 3 | 108 | 29,826,550,000 | 1,898,450,000 | 1,898,506,250.0 | 56,250.0 | 8 | 2702 |
| 3 | 109 | 29,827,252,500 | 1,897,747,500 | 1,897,803,750.0 | 56,250.0 | 8 | 2701 |
| 3 | 110 | 29,827,955,000 | 1,897,045,000 | 1,897,101,250.0 | 56,250.0 | 8 | 2700 |
| 3 | 111 | 29,828,657,500 | 1,896,342,500 | 1,896,398,750.0 | 56,250.0 | 8 | 2699 |
| 3 | 112 | 29,829,360,000 | 1,895,640,000 | 1,895,696,250.0 | 56,250.0 | 8 | 2698 |
| 3 | 113 | 29,830,062,500 | 1,894,937,500 | 1,894,993,750.0 | 56,250.0 | 8 | 2697 |
| 3 | 114 | 29,830,765,000 | 1,894,235,000 | 1,894,291,250.0 | 56,250.0 | 8 | 2696 |
| 3 | 115 | 29,831,467,500 | 1,893,532,500 | 1,893,588,750.0 | 56,250.0 | 8 | 2695 |
| 3 | 116 | 29,832,170,000 | 1,892,830,000 | 1,892,886,250.0 | 56,250.0 | 8 | 2694 |
| 3 | 117 | 29,832,872,500 | 1,892,127,500 | 1,892,183,750.0 | 56,250.0 | 8 | 2693 |
| 3 | 118 | 29,833,575,000 | 1,891,425,000 | 1,891,481,250.0 | 56,250.0 | 8 | 2692 |
| 3 | 119 | 29,834,277,500 | 1,890,722,500 | 1,890,778,750.0 | 56,250.0 | 8 | 2691 |
| 3 | 120 | 29,834,980,000 | 1,890,020,000 | 1,890,076,250.0 | 56,250.0 | 8 | 2690 |
| 3 | 121 | 29,835,682,500 | 1,889,317,500 | 1,889,373,750.0 | 56,250.0 | 8 | 2689 |
| 3 | 122 | 29,836,385,000 | 1,888,615,000 | 1,888,671,250.0 | 56,250.0 | 8 | 2688 |
| 3 | 123 | 29,837,087,500 | 1,887,912,500 | 1,887,968,750.0 | 56,250.0 | 8 | 2687 |
| 3 | 124 | 29,837,790,000 | 1,887,210,000 | 1,887,266,250.0 | 56,250.0 | 8 | 2686 |
| 3 | 125 | 29,838,492,500 | 1,886,507,500 | 1,886,563,750.0 | 56,250.0 | 8 | 2685 |
| 3 | 126 | 29,839,195,000 | 1,885,805,000 | 1,885,861,250.0 | 56,250.0 | 8 | 2684 |
| 3 | 127 | 29,839,897,500 | 1,885,102,500 | 1,885,158,750.0 | 56,250.0 | 8 | 2683 |
| 3 | 128 | 29,840,600,000 | 1,884,400,000 | 1,884,456,250.0 | 56,250.0 | 8 | 2682 |
| 3 | 129 | 29,841,302,500 | 1,883,697,500 | 1,883,753,750.0 | 56,250.0 | 8 | 2681 |
| 3 | 130 | 29,842,005,000 | 1,882,995,000 | 1,883,051,250.0 | 56,250.0 | 8 | 2680 |
| 3 | 131 | 29,842,707,500 | 1,882,292,500 | 1,882,348,750.0 | 56,250.0 | 8 | 2679 |
| 3 | 132 | 29,843,410,000 | 1,881,590,000 | 1,881,646,250.0 | 56,250.0 | 8 | 2678 |
| 3 | 133 | 29,844,112,500 | 1,880,887,500 | 1,880,943,750.0 | 56,250.0 | 8 | 2677 |
| 3 | 134 | 29,844,815,000 | 1,880,185,000 | 1,880,241,250.0 | 56,250.0 | 8 | 2676 |
| 3 | 135 | 29,845,517,500 | 1,879,482,500 | 1,879,538,750.0 | 56,250.0 | 8 | 2675 |
| 3 | 136 | 29,846,220,000 | 1,878,780,000 | 1,878,836,250.0 | 56,250.0 | 8 | 2674 |
| 3 | 137 | 29,846,922,500 | 1,878,077,500 | 1,878,133,750.0 | 56,250.0 | 8 | 2673 |
| 3 | 138 | 29,847,625,000 | 1,877,375,000 | 1,877,431,250.0 | 56,250.0 | 8 | 2672 |
| 3 | 139 | 29,848,327,500 | 1,876,672,500 | 1,876,728,750.0 | 56,250.0 | 8 | 2671 |
| 3 | 140 | 29,849,030,000 | 1,875,970,000 | 1,876,026,250.0 | 56,250.0 | 8 | 2670 |
| 3 | 141 | 29,849,732,500 | 1,875,267,500 | 1,875,323,750.0 | 56,250.0 | 8 | 2669 |
| 3 | 142 | 29,850,435,000 | 1,874,565,000 | 1,874,621,250.0 | 56,250.0 | 8 | 2668 |
| 3 | 143 | 29,851,137,500 | 1,873,862,500 | 1,873,918,750.0 | 56,250.0 | 8 | 2667 |
| 3 | 144 | 29,851,840,000 | 1,873,160,000 | 1,873,216,250.0 | 56,250.0 | 8 | 2666 |
| 3 | 145 | 29,852,542,500 | 1,872,457,500 | 1,872,513,750.0 | 56,250.0 | 8 | 2665 |
| 3 | 146 | 29,853,245,000 | 1,871,755,000 | 1,871,811,250.0 | 56,250.0 | 8 | 2664 |
| 3 | 147 | 29,853,947,500 | 1,871,052,500 | 1,871,108,750.0 | 56,250.0 | 8 | 2663 |
| 3 | 148 | 29,854,650,000 | 1,870,350,000 | 1,870,406,250.0 | 56,250.0 | 8 | 2662 |
| 3 | 149 | 29,855,352,500 | 1,869,647,500 | 1,869,703,750.0 | 56,250.0 | 8 | 2661 |
| 3 | 150 | 29,856,055,000 | 1,868,945,000 | 1,869,001,250.0 | 56,250.0 | 8 | 2660 |
| 3 | 151 | 29,856,757,500 | 1,868,242,500 | 1,868,298,750.0 | 56,250.0 | 8 | 2659 |
| 3 | 152 | 29,857,460,000 | 1,867,540,000 | 1,867,596,250.0 | 56,250.0 | 8 | 2658 |
| 3 | 153 | 29,858,162,500 | 1,866,837,500 | 1,866,893,750.0 | 56,250.0 | 8 | 2657 |
| 3 | 154 | 29,858,865,000 | 1,866,135,000 | 1,866,191,250.0 | 56,250.0 | 8 | 2656 |
| 3 | 155 | 29,859,567,500 | 1,865,432,500 | 1,865,488,750.0 | 56,250.0 | 8 | 2655 |
| 3 | 156 | 29,860,270,000 | 1,864,730,000 | 1,864,786,250.0 | 56,250.0 | 8 | 2654 |
| 3 | 157 | 29,860,972,500 | 1,864,027,500 | 1,864,083,750.0 | 56,250.0 | 8 | 2653 |
| 3 | 158 | 29,861,675,000 | 1,863,325,000 | 1,863,381,250.0 | 56,250.0 | 8 | 2652 |
| 3 | 159 | 29,862,377,500 | 1,862,622,500 | 1,862,678,750.0 | 56,250.0 | 8 | 2651 |
| 3 | 160 | 29,863,080,000 | 1,861,920,000 | 1,861,976,250.0 | 56,250.0 | 8 | 2650 |
| 3 | 161 | 29,863,782,500 | 1,861,217,500 | 1,861,273,750.0 | 56,250.0 | 8 | 2649 |
| 3 | 162 | 29,864,485,000 | 1,860,515,000 | 1,860,571,250.0 | 56,250.0 | 8 | 2648 |
| 3 | 163 | 29,865,187,500 | 1,859,812,500 | 1,859,868,750.0 | 56,250.0 | 8 | 2647 |
| 3 | 164 | 29,865,890,000 | 1,859,110,000 | 1,859,166,250.0 | 56,250.0 | 8 | 2646 |
| 3 | 165 | 29,866,592,500 | 1,858,407,500 | 1,858,463,750.0 | 56,250.0 | 8 | 2645 |
| 3 | 166 | 29,867,295,000 | 1,857,705,000 | 1,857,761,250.0 | 56,250.0 | 8 | 2644 |
| 3 | 167 | 29,867,997,500 | 1,857,002,500 | 1,857,058,750.0 | 56,250.0 | 8 | 2643 |
| 3 | 168 | 29,868,700,000 | 1,856,300,000 | 1,856,356,250.0 | 56,250.0 | 8 | 2642 |
| 3 | 169 | 29,869,402,500 | 1,855,597,500 | 1,855,653,750.0 | 56,250.0 | 8 | 2641 |
| 3 | 170 | 29,870,105,000 | 1,854,895,000 | 1,854,951,250.0 | 56,250.0 | 8 | 2640 |
| 3 | 171 | 29,870,807,500 | 1,854,192,500 | 1,854,248,750.0 | 56,250.0 | 8 | 2639 |
| 3 | 172 | 29,871,510,000 | 1,853,490,000 | 1,853,546,250.0 | 56,250.0 | 8 | 2638 |

TABLE 4-continued

Tuning Commands for Class A - Band 3

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 3 | 173 | 29,872,212,500 | 1,852,787,500 | 1,852,843,750.0 | 56,250.0 | 8 | 2637 |
| 3 | 174 | 29,872,915,000 | 1,852,085,000 | 1,852,141,250.0 | 56,250.0 | 8 | 2636 |
| 3 | 175 | 29,873,617,500 | 1,851,382,500 | 1,851,438,750.0 | 56,250.0 | 8 | 2635 |

TABLE 5

Tuning Commands for Class A - Band 4

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 1 | 1 | 29,876,382,500 | 1,848,617,500 | 1,848,628,750.0 | 11,250.0 | 8 | 2631 |
| 4 | 2 | 29,877,085,000 | 1,847,915,000 | 1,847,926,250.0 | 11,250.0 | 8 | 2630 |
| 4 | 3 | 29,877,787,500 | 1,847,212,500 | 1,847,223,750.0 | 11,250.0 | 8 | 2629 |
| 4 | 4 | 29,878,490,000 | 1,846,510,000 | 1,846,521,250.0 | 11,250.0 | 8 | 2628 |
| 4 | 5 | 29,879,192,500 | 1,845,807,500 | 1,845,818,750.0 | 11,250.0 | 8 | 2627 |
| 4 | 6 | 29,879,895,000 | 1,845,105,000 | 1,845,116,250.0 | 11,250.0 | 8 | 2626 |
| 4 | 7 | 29,880,597,500 | 1,844,402,500 | 1,844,413,750.0 | 11,250.0 | 8 | 2625 |
| 4 | 8 | 29,881,300,000 | 1,843,700,000 | 1,843,711,250.0 | 11,250.0 | 8 | 2624 |
| 4 | 9 | 29,882,002,500 | 1,842,997,500 | 1,843,008,750.0 | 11,250.0 | 8 | 2623 |
| 4 | 10 | 29,882,705,000 | 1,842,295,000 | 1,842,306,250.0 | 11,250.0 | 8 | 2622 |
| 4 | 11 | 29,883,407,500 | 1,841,592,500 | 1,841,603,750.0 | 11,250.0 | 8 | 2621 |
| 4 | 12 | 29,884,110,000 | 1,840,890,000 | 1,840,901,250.0 | 11,250.0 | 8 | 2620 |
| 4 | 13 | 29,884,812,500 | 1,840,187,500 | 1,840,198,750.0 | 11,250.0 | 8 | 2619 |
| 4 | 14 | 29,885,515,000 | 1,839,485,000 | 1,839,496,250.0 | 11,250.0 | 8 | 2618 |
| 4 | 15 | 29,886,217,500 | 1,838,782,500 | 1,838,793,750.0 | 11,250.0 | 8 | 2617 |
| 4 | 16 | 29,886,920,000 | 1,838,080,000 | 1,838,091,250.0 | 11,250.0 | 8 | 2616 |
| 4 | 17 | 29,887,622,500 | 1,837,377,500 | 1,837,388,750.0 | 11,250.0 | 8 | 2615 |
| 4 | 18 | 29,888,325,000 | 1,836,675,000 | 1,836,686,250.0 | 11,250.0 | 8 | 2614 |
| 4 | 19 | 29,889,027,500 | 1,835,972,500 | 1,835,983,750.0 | 11,250.0 | 8 | 2613 |
| 4 | 20 | 29,889,730,000 | 1,835,270,000 | 1,835,281,250.0 | 11,250.0 | 8 | 2612 |
| 4 | 21 | 29,890,432,500 | 1,834,567,500 | 1,834,578,750.0 | 11,250.0 | 8 | 2611 |
| 4 | 22 | 29,891,135,000 | 1,833,865,000 | 1,833,876,250.0 | 11,250.0 | 8 | 2610 |
| 4 | 23 | 29,891,837,500 | 1,833,162,500 | 1,833,173,750.0 | 11,250.0 | 8 | 2609 |
| 4 | 24 | 29,892,540,000 | 1,832,460,000 | 1,832,471,250.0 | 11,250.0 | 8 | 2608 |
| 4 | 25 | 29,893,242,500 | 1,831,757,500 | 1,831,768,750.0 | 11,250.0 | 8 | 2607 |
| 4 | 26 | 29,893,945,000 | 1,831,055,000 | 1,831,066,250.0 | 11,250.0 | 8 | 2606 |
| 4 | 27 | 29,894,647,500 | 1,830,352,500 | 1,830,363,750.0 | 11,250.0 | 8 | 2605 |
| 4 | 28 | 29,895,350,000 | 1,829,650,000 | 1,829,661,250.0 | 11,250.0 | 8 | 2604 |
| 4 | 29 | 29,896,052,500 | 1,828,947,500 | 1,828,958,750.0 | 11,250.0 | 8 | 2603 |
| 4 | 30 | 29,896,755,000 | 1,828,245,000 | 1,828,256,250.0 | 11,250.0 | 8 | 2602 |
| 4 | 31 | 29,897,457,500 | 1,827,542,500 | 1,827,553,750.0 | 11,250.0 | 8 | 2601 |
| 4 | 32 | 29,898,160,000 | 1,826,840,000 | 1,826,851,250.0 | 11,250.0 | 8 | 2600 |
| 4 | 33 | 29,898,862,500 | 1,826,137,500 | 1,826,148,750.0 | 11,250.0 | 8 | 2599 |
| 4 | 34 | 29,899,565,000 | 1,825,435,000 | 1,825,446,250.0 | 11,250.0 | 8 | 2598 |
| 4 | 35 | 29,900,267,500 | 1,824,732,500 | 1,824,743,750.0 | 11,250.0 | 8 | 2597 |
| 4 | 36 | 29,900,970,000 | 1,824,030,000 | 1,824,041,250.0 | 11,250.0 | 8 | 2596 |
| 4 | 37 | 29,901,672,500 | 1,823,327,500 | 1,823,338,750.0 | 11,250.0 | 8 | 2595 |
| 4 | 38 | 29,902,375,000 | 1,822,625,000 | 1,822,636,250.0 | 11,250.0 | 8 | 2594 |
| 4 | 39 | 29,903,077,500 | 1,821,922,500 | 1,821,933,750.0 | 11,250.0 | 8 | 2593 |
| 4 | 40 | 29,903,780,000 | 1,821,220,000 | 1,821,231,250.0 | 11,250.0 | 8 | 2592 |
| 4 | 41 | 29,904,482,500 | 1,820,517,500 | 1,820,528,750.0 | 11,250.0 | 8 | 2591 |
| 4 | 42 | 29,905,185,000 | 1,819,815,000 | 1,819,826,250.0 | 11,250.0 | 8 | 2590 |
| 4 | 43 | 29,905,887,500 | 1,819,112,500 | 1,819,123,750.0 | 11,250.0 | 8 | 2589 |
| 4 | 44 | 29,906,590,000 | 1,818,410,000 | 1,818,421,250.0 | 11,250.0 | 8 | 2588 |
| 4 | 45 | 29,907,292,500 | 1,817,707,500 | 1,817,718,750.0 | 11,250.0 | 8 | 2587 |
| 4 | 46 | 29,907,995,000 | 1,817,005,000 | 1,817,016,250.0 | 11,250.0 | 8 | 2586 |
| 4 | 47 | 29,908,697,500 | 1,816,302,500 | 1,816,313,750.0 | 11,250.0 | 8 | 2585 |
| 4 | 48 | 29,909,400,000 | 1,815,600,000 | 1,815,611,250.0 | 11,250.0 | 8 | 2584 |
| 4 | 49 | 29,910,102,500 | 1,814,897,500 | 1,814,908,750.0 | 11,250.0 | 8 | 2583 |
| 4 | 50 | 29,910,805,000 | 1,814,195,000 | 1,814,206,250.0 | 11,250.0 | 8 | 2582 |
| 4 | 51 | 29,911,507,500 | 1,813,492,500 | 1,813,503,750.0 | 11,250.0 | 8 | 2581 |
| 4 | 52 | 29,912,210,000 | 1,812,790,000 | 1,812,801,250.0 | 11,250.0 | 8 | 2580 |
| 4 | 53 | 29,912,912,500 | 1,812,087,500 | 1,812,098,750.0 | 11,250.0 | 8 | 2579 |
| 4 | 54 | 29,913,615,000 | 1,811,385,000 | 1,811,396,250.0 | 11,250.0 | 8 | 2578 |
| 4 | 55 | 29,914,317,500 | 1,810,682,500 | 1,810,693,750.0 | 11,250.0 | 8 | 2577 |
| 4 | 56 | 29,915,020,000 | 1,809,980,000 | 1,809,991,250.0 | 11,250.0 | 8 | 2576 |

TABLE 5-continued

Tuning Commands for Class A - Band 4

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 4 | 57 | 29,915,722,500 | 1,809,277,500 | 1,809,288,750.0 | 11,250.0 | 8 | 2575 |
| 4 | 58 | 29,916,425,000 | 1,808,575,000 | 1,808,586,250.0 | 11,250.0 | 8 | 2574 |
| 4 | 59 | 29,917,127,500 | 1,807,872,500 | 1,807,883,750.0 | 11,250.0 | 8 | 2573 |
| 4 | 60 | 29,917,830,000 | 1,807,170,000 | 1,807,181,250.0 | 11,250.0 | 8 | 2572 |
| 4 | 61 | 29,918,532,500 | 1,806,467,500 | 1,806,478,750.0 | 11,250.0 | 8 | 2571 |
| 4 | 62 | 29,919,235,000 | 1,805,765,000 | 1,805,776,250.0 | 11,250.0 | 8 | 2570 |
| 4 | 63 | 29,919,937,500 | 1,805,062,500 | 1,805,073,750.0 | 11,250.0 | 8 | 2569 |
| 4 | 64 | 29,920,640,000 | 1,804,360,000 | 1,804,371,250.0 | 11,250.0 | 8 | 2568 |
| 4 | 65 | 29,921,342,500 | 1,803,657,500 | 1,803,668,750.0 | 11,250.0 | 8 | 2567 |
| 4 | 66 | 29,922,045,000 | 1,802,955,000 | 1,802,966,250.0 | 11,250.0 | 8 | 2566 |
| 4 | 67 | 29,922,747,500 | 1,802,252,500 | 1,802,263,750.0 | 11,250.0 | 8 | 2565 |
| 4 | 68 | 29,923,450,000 | 1,801,550,000 | 1,801,561,250.0 | 11,250.0 | 8 | 2564 |
| 4 | 69 | 29,924,152,500 | 1,800,847,500 | 1,800,858,750.0 | 11,250.0 | 8 | 2563 |
| 4 | 70 | 29,924,855,000 | 1,800,145,000 | 1,800,156,250.0 | 11,250.0 | 8 | 2562 |
| 4 | 71 | 29,925,557,500 | 1,799,442,500 | 1,799,453,750.0 | 11,250.0 | 8 | 2561 |
| 4 | 72 | 29,926,260,000 | 1,798,740,000 | 1,798,751,250.0 | 11,250.0 | 8 | 2560 |
| 4 | 73 | 29,926,962,500 | 1,798,037,500 | 1,798,048,750.0 | 11,250.0 | 8 | 2559 |
| 4 | 74 | 29,927,665,000 | 1,797,335,000 | 1,797,346,250.0 | 11,250.0 | 8 | 2558 |
| 4 | 75 | 29,928,367,500 | 1,796,632,500 | 1,796,643,750.0 | 11,250.0 | 8 | 2557 |
| 4 | 76 | 29,929,070,000 | 1,795,930,000 | 1,795,941,250.0 | 11,250.0 | 8 | 2556 |
| 4 | 77 | 29,929,772,500 | 1,795,227,500 | 1,795,238,750.0 | 11,250.0 | 8 | 2555 |
| 4 | 78 | 29,930,475,000 | 1,794,525,000 | 1,794,536,250.0 | 11,250.0 | 8 | 2554 |
| 4 | 79 | 29,931,177,500 | 1,793,822,500 | 1,793,833,750.0 | 11,250.0 | 8 | 2553 |
| 4 | 80 | 29,931,880,000 | 1,793,120,000 | 1,793,131,250.0 | 11,250.0 | 8 | 2552 |
| 4 | 81 | 29,932,582,500 | 1,792,417,500 | 1,792,428,750.0 | 11,250.0 | 8 | 2551 |
| 4 | 82 | 29,933,285,000 | 1,791,715,000 | 1,791,726,250.0 | 11,250.0 | 8 | 2550 |
| 4 | 83 | 29,933,987,500 | 1,791,012,500 | 1,791,023,750.0 | 11,250.0 | 8 | 2549 |
| 4 | 84 | 29,934,690,000 | 1,790,310,000 | 1,790,321,250.0 | 11,250.0 | 8 | 2548 |
| 4 | 85 | 29,935,392,500 | 1,789,607,500 | 1,789,618,750.0 | 11,250.0 | 8 | 2547 |
| 4 | 86 | 29,936,095,000 | 1,788,905,000 | 1,788,916,250.0 | 11,250.0 | 8 | 2546 |
| 4 | 87 | 29,936,797,500 | 1,788,202,500 | 1,788,213,750.0 | 11,250.0 | 8 | 2545 |
| 4 | 88 | 29,937,500,000 | 1,787,500,000 | 1,787,511,250.0 | 11,250.0 | 8 | 2544 |
| 4 | 89 | 29,938,202,500 | 1,786,797,500 | 1,786,808,750.0 | 11,250.0 | 8 | 2543 |
| 4 | 90 | 29,938,905,000 | 1,786,095,000 | 1,786,106,250.0 | 11,250.0 | 8 | 2542 |
| 4 | 91 | 29,939,607,500 | 1,785,392,500 | 1,785,403,750.0 | 11,250.0 | 8 | 2541 |
| 4 | 92 | 29,940,310,000 | 1,784,690,000 | 1,784,701,250.0 | 11,250.0 | 8 | 2540 |
| 4 | 93 | 29,941,012,500 | 1,783,987,500 | 1,783,998,750.0 | 11,250.0 | 8 | 2539 |
| 4 | 94 | 29,941,715,000 | 1,783,285,000 | 1,783,296,250.0 | 11,250.0 | 8 | 2538 |
| 4 | 95 | 29,942,417,500 | 1,782,582,500 | 1,782,593,750.0 | 11,250.0 | 8 | 2537 |
| 4 | 96 | 29,943,120,000 | 1,781,880,000 | 1,781,891,250.0 | 11,250.0 | 8 | 2536 |
| 4 | 97 | 29,943,822,500 | 1,781,177,500 | 1,781,188,750.0 | 11,250.0 | 8 | 2535 |
| 4 | 98 | 29,944,525,000 | 1,780,475,000 | 1,780,486,250.0 | 11,250.0 | 8 | 2534 |
| 4 | 99 | 29,945,227,500 | 1,779,772,500 | 1,779,783,750.0 | 11,250.0 | 8 | 2533 |
| 4 | 100 | 29,945,930,000 | 1,779,070,000 | 1,779,081,250.0 | 11,250.0 | 8 | 2532 |
| 4 | 101 | 29,946,632,500 | 1,778,367,500 | 1,778,378,750.0 | 11,250.0 | 8 | 2531 |
| 4 | 102 | 29,947,335,000 | 1,777,665,000 | 1,777,676,250.0 | 11,250.0 | 8 | 2530 |
| 4 | 103 | 29,948,037,500 | 1,776,962,500 | 1,776,973,750.0 | 11,250.0 | 8 | 2529 |
| 4 | 104 | 29,948,740,000 | 1,776,260,000 | 1,776,271,250.0 | 11,250.0 | 8 | 2528 |
| 4 | 105 | 29,949,442,500 | 1,775,557,500 | 1,775,568,750.0 | 11,250.0 | 8 | 2527 |
| 4 | 106 | 29,950,145,000 | 1,774,855,000 | 1,774,866,250.0 | 11,250.0 | 8 | 2526 |
| 4 | 107 | 29,950,847,500 | 1,774,152,500 | 1,774,163,750.0 | 11,250.0 | 8 | 2525 |
| 4 | 108 | 29,951,550,000 | 1,773,450,000 | 1,773,461,250.0 | 11,250.0 | 8 | 2524 |
| 4 | 109 | 29,952,252,500 | 1,772,747,500 | 1,772,758,750.0 | 11,250.0 | 8 | 2523 |
| 4 | 110 | 29,952,955,000 | 1,772,045,000 | 1,772,056,250.0 | 11,250.0 | 8 | 2522 |
| 4 | 111 | 29,953,657,500 | 1,771,342,500 | 1,771,353,750.0 | 11,250.0 | 8 | 2521 |
| 4 | 112 | 29,954,360,000 | 1,770,640,000 | 1,770,651,250.0 | 11,250.0 | 8 | 2520 |
| 4 | 113 | 29,955,062,500 | 1,769,937,500 | 1,769,948,750.0 | 11,250.0 | 8 | 2519 |
| 4 | 114 | 29,955,765,000 | 1,769,235,000 | 1,769,246,250.0 | 11,250.0 | 8 | 2518 |
| 4 | 115 | 29,956,467,500 | 1,768,532,500 | 1,768,543,750.0 | 11,250.0 | 8 | 2517 |
| 4 | 116 | 29,957,170,000 | 1,767,830,000 | 1,767,841,250.0 | 11,250.0 | 8 | 2516 |
| 4 | 117 | 29,957,872,500 | 1,767,127,500 | 1,767,138,750.0 | 11,250.0 | 8 | 2515 |
| 4 | 118 | 29,958,575,000 | 1,766,425,000 | 1,766,436,250.0 | 11,250.0 | 8 | 2514 |
| 4 | 119 | 29,959,277,500 | 1,765,722,500 | 1,765,733,750.0 | 11,250.0 | 8 | 2513 |
| 4 | 120 | 29,959,980,000 | 1,765,020,000 | 1,765,031,250.0 | 11,250.0 | 8 | 2512 |
| 4 | 121 | 29,960,682,500 | 1,764,317,500 | 1,764,328,750.0 | 11,250.0 | 8 | 2511 |
| 4 | 122 | 29,961,385,000 | 1,763,615,000 | 1,763,626,250.0 | 11,250.0 | 8 | 2510 |
| 4 | 123 | 29,962,087,500 | 1,762,912,500 | 1,762,923,750.0 | 11,250.0 | 8 | 2509 |
| 4 | 124 | 29,962,790,000 | 1,762,210,000 | 1,762,221,250.0 | 11,250.0 | 8 | 2508 |
| 4 | 125 | 29,963,492,500 | 1,761,507,500 | 1,761,518,750.0 | 11,250.0 | 8 | 2507 |
| 4 | 126 | 29,964,195,000 | 1,760,805,000 | 1,760,816,250.0 | 11,250.0 | 8 | 2506 |
| 4 | 127 | 29,964,897,500 | 1,760,102,500 | 1,760,113,750.0 | 11,250.0 | 8 | 2505 |
| 4 | 128 | 29,965,600,000 | 1,759,400,000 | 1,759,411,250.0 | 11,250.0 | 8 | 2504 |

TABLE 5-continued

Tuning Commands for Class A - Band 4

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 4 | 129 | 29,966,302,500 | 1,758,697,500 | 1,758,708,750.0 | 11,250.0 | 8 | 2503 |
| 4 | 130 | 29,967,005,000 | 1,757,995,000 | 1,758,006,250.0 | 11,250.0 | 8 | 2502 |
| 4 | 131 | 29,967,707,500 | 1,757,292,500 | 1,757,303,750.0 | 11,250.0 | 8 | 2501 |
| 4 | 132 | 29,968,410,000 | 1,756,590,000 | 1,756,601,250.0 | 11,250.0 | 8 | 2500 |
| 4 | 133 | 29,969,112,500 | 1,755,887,500 | 1,755,898,750.0 | 11,250.0 | 8 | 2499 |
| 4 | 134 | 29,969,815,000 | 1,755,185,000 | 1,755,196,250.0 | 11,250.0 | 8 | 2498 |
| 4 | 135 | 29,970,517,500 | 1,754,482,500 | 1,754,493,750.0 | 11,250.0 | 8 | 2497 |
| 4 | 136 | 29,971,220,000 | 1,753,780,000 | 1,753,791,250.0 | 11,250.0 | 8 | 2496 |
| 4 | 137 | 29,971,922,500 | 1,753,077,500 | 1,753,088,750.0 | 11,250.0 | 8 | 2495 |
| 4 | 138 | 29,972,625,000 | 1,752,375,000 | 1,752,386,250.0 | 11,250.0 | 8 | 2494 |
| 4 | 139 | 29,973,327,500 | 1,751,672,500 | 1,751,683,750.0 | 11,250.0 | 8 | 2493 |
| 4 | 140 | 29,974,030,000 | 1,750,970,000 | 1,750,981,250.0 | 11,250.0 | 8 | 2492 |
| 4 | 141 | 29,974,732,500 | 1,750,267,500 | 1,750,278,750.0 | 11,250.0 | 8 | 2491 |
| 4 | 142 | 29,975,435,000 | 1,749,565,000 | 1,749,576,250.0 | 11,250.0 | 8 | 2490 |
| 4 | 143 | 29,976,137,500 | 1,748,862,500 | 1,748,873,750.0 | 11,250.0 | 8 | 2489 |
| 4 | 144 | 29,976,840,000 | 1,748,160,000 | 1,748,171,250.0 | 11,250.0 | 8 | 2488 |
| 4 | 145 | 29,977,542,500 | 1,747,457,500 | 1,747,468,750.0 | 11,250.0 | 8 | 2487 |
| 4 | 146 | 29,978,245,000 | 1,746,755,000 | 1,746,766,250.0 | 11,250.0 | 8 | 2486 |
| 4 | 147 | 29,978,947,500 | 1,746,052,500 | 1,746,063,750.0 | 11,250.0 | 8 | 2485 |
| 4 | 148 | 29,979,650,000 | 1,745,350,000 | 1,745,361,250.0 | 11,250.0 | 8 | 2484 |
| 4 | 149 | 29,980,352,500 | 1,744,647,500 | 1,744,658,750.0 | 11,250.0 | 8 | 2483 |
| 4 | 150 | 29,981,055,000 | 1,743,945,000 | 1,743,956,250.0 | 11,250.0 | 8 | 2482 |
| 4 | 151 | 29,981,757,500 | 1,743,242,500 | 1,743,253,750.0 | 11,250.0 | 8 | 2481 |
| 4 | 152 | 29,982,460,000 | 1,742,540,000 | 1,742,551,250.0 | 11,250.0 | 8 | 2480 |
| 4 | 153 | 29,983,162,500 | 1,741,837,500 | 1,741,848,750.0 | 11,250.0 | 8 | 2479 |
| 4 | 154 | 29,983,865,000 | 1,741,135,000 | 1,741,146,250.0 | 11,250.0 | 8 | 2478 |
| 4 | 155 | 29,984,567,500 | 1,740,432,500 | 1,740,443,750.0 | 11,250.0 | 8 | 2477 |
| 4 | 156 | 29,985,270,000 | 1,739,730,000 | 1,739,741,250.0 | 11,250.0 | 8 | 2476 |
| 4 | 157 | 29,985,972,500 | 1,739,027,500 | 1,739,038,750.0 | 11,250.0 | 8 | 2475 |
| 4 | 158 | 29,986,675,000 | 1,738,325,000 | 1,738,336,250.0 | 11,250.0 | 8 | 2474 |
| 4 | 159 | 29,987,377,500 | 1,737,622,500 | 1,737,633,750.0 | 11,250.0 | 8 | 2473 |
| 4 | 160 | 29,988,080,000 | 1,736,920,000 | 1,736,931,250.0 | 11,250.0 | 8 | 2472 |
| 4 | 161 | 29,988,782,500 | 1,736,217,500 | 1,736,228,750.0 | 11,250.0 | 8 | 2471 |
| 4 | 162 | 29,989,485,000 | 1,735,515,000 | 1,735,526,250.0 | 11,250.0 | 8 | 2470 |
| 4 | 163 | 29,990,187,500 | 1,734,812,500 | 1,734,823,750.0 | 11,250.0 | 8 | 2469 |
| 4 | 164 | 29,990,890,000 | 1,734,110,000 | 1,734,121,250.0 | 11,250.0 | 8 | 2468 |
| 4 | 165 | 29,991,592,500 | 1,733,407,500 | 1,733,418,750.0 | 11,250.0 | 8 | 2467 |
| 4 | 166 | 29,992,295,000 | 1,732,705,000 | 1,732,716,250.0 | 11,250.0 | 8 | 2466 |
| 4 | 167 | 29,992,997,500 | 1,732,002,500 | 1,732,013,750.0 | 11,250.0 | 8 | 2465 |
| 4 | 168 | 29,993,700,000 | 1,731,300,000 | 1,731,311,250.0 | 11,250.0 | 8 | 2464 |
| 4 | 169 | 29,994,402,500 | 1,730,597,500 | 1,730,608,750.0 | 11,250.0 | 8 | 2463 |
| 4 | 170 | 29,995,105,000 | 1,729,895,000 | 1,729,906,250.0 | 11,250.0 | 8 | 2462 |
| 4 | 171 | 29,995,807,500 | 1,729,192,500 | 1,729,203,750.0 | 11,250.0 | 8 | 2461 |
| 4 | 172 | 29,996,510,000 | 1,728,490,000 | 1,728,501,250.0 | 11,250.0 | 8 | 2460 |
| 4 | 173 | 29,997,212,500 | 1,727,787,500 | 1,727,798,750.0 | 11,250.0 | 8 | 2459 |
| 4 | 174 | 29,997,915,000 | 1,727,085,000 | 1,727,096,250.0 | 11,250.0 | 8 | 2458 |
| 4 | 175 | 29,998,617,500 | 1,726,382,500 | 1,726,393,750.0 | 11,250.0 | 8 | 2457 |

TABLE 6

Tuning Commands for Class B - Band 1

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 1 | 1 | 29,502,787,500 | 2,222,212,500 | 2,222,241,666.7 | 29,166.7 | 16 | 948 |
| 1 | 2 | 29,506,300,000 | 2,218,700,000 | 2,218,729,166.7 | 29,166.7 | 8 | 947 |
| 1 | 3 | 29,509,812,500 | 2,215,187,500 | 2,215,216,666.7 | 29,166.7 | 16 | 945 |
| 1 | 4 | 29,513,325,000 | 2,211,675,000 | 2,211,704,166.7 | 29,166.7 | 8 | 944 |
| 1 | 5 | 29,516,837,500 | 2,208,162,500 | 2,208,191,666.7 | 29,166.7 | 16 | 942 |
| 1 | 6 | 29,520,350,000 | 2,204,650,000 | 2,204,679,166.7 | 29,166.7 | 8 | 941 |
| 1 | 7 | 29,523,862,500 | 2,201,137,500 | 2,201,166,666.7 | 29,166.7 | 16 | 939 |
| 1 | 8 | 29,527,375,000 | 2,197,625,000 | 2,197,654,166.7 | 29,166.7 | 8 | 938 |
| 1 | 9 | 29,530,887,500 | 2,194,112,500 | 2,194,141,666.7 | 29,166.7 | 16 | 936 |
| 1 | 10 | 29,534,400,000 | 2,190,600,000 | 2,190,629,166.7 | 29,166.7 | 8 | 935 |
| 1 | 11 | 29,537,912,500 | 2,187,087,500 | 2,187,116,666.7 | 29,166.7 | 16 | 933 |
| 1 | 12 | 29,541,425,000 | 2,183,575,000 | 2,183,604,166.7 | 29,166.7 | 8 | 932 |

TABLE 6-continued

Tuning Commands for Class B - Band 1

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 1 | 13 | 29,544,937,500 | 2,180,062,500 | 2,180,091,666.7 | 29,166.7 | 16 | 930 |
| 1 | 14 | 29,548,450,000 | 2,176,550,000 | 2,176,579,166.7 | 29,166.7 | 8 | 929 |
| 1 | 15 | 29,551,962,500 | 2,173,037,500 | 2,173,066,666.7 | 29,166.7 | 16 | 927 |
| 1 | 16 | 29,555,475,000 | 2,169,525,000 | 2,169,554,166.7 | 29,166.7 | 8 | 926 |
| 1 | 17 | 29,558,987,500 | 2,166,012,500 | 2,166,041,666.7 | 29,166.7 | 16 | 924 |
| 1 | 18 | 29,562,500,000 | 2,162,500,000 | 2,162,529,166.7 | 29,166.7 | 8 | 923 |
| 1 | 19 | 29,566,012,500 | 2,158,987,500 | 2,159,016,666.7 | 29,166.7 | 16 | 921 |
| 1 | 20 | 29,569,525,000 | 2,155,475,000 | 2,155,504,166.7 | 29,166.7 | 8 | 920 |
| 1 | 21 | 29,573,037,500 | 2,151,962,500 | 2,151,991,666.7 | 29,166.7 | 16 | 918 |
| 1 | 22 | 29,576,550,000 | 2,148,450,000 | 2,148,479,166.7 | 29,166.7 | 8 | 917 |
| 1 | 23 | 29,580,062,500 | 2,144,937,500 | 2,144,966,666.7 | 29,166.7 | 16 | 915 |
| 1 | 24 | 29,583,575,000 | 2,141,425,000 | 2,141,454,166.7 | 29,166.7 | 8 | 914 |
| 1 | 25 | 29,587,087,500 | 2,137,912,500 | 2,137,941,666.7 | 29,166.7 | 16 | 912 |
| 1 | 26 | 29,590,600,000 | 2,134,400,000 | 2,134,429,166.7 | 29,166.7 | 8 | 911 |
| 1 | 27 | 29,594,112,500 | 2,130,887,500 | 2,130,916,666.7 | 29,166.7 | 16 | 909 |
| 1 | 28 | 29,597,625,000 | 2,127,375,000 | 2,127,404,166.7 | 29,166.7 | 8 | 908 |
| 1 | 29 | 29,601,137,500 | 2,123,862,500 | 2,123,891,666.7 | 29,166.7 | 16 | 906 |
| 1 | 30 | 29,604,650,000 | 2,120,350,000 | 2,120,379,166.7 | 29,166.7 | 8 | 905 |
| 1 | 31 | 29,608,162,500 | 2,116,837,500 | 2,116,866,666.7 | 29,166.7 | 16 | 903 |
| 1 | 32 | 29,611,675,000 | 2,113,325,000 | 2,113,354,166.7 | 29,166.7 | 8 | 902 |
| 1 | 33 | 29,615,187,500 | 2,109,812,500 | 2,109,841,666.7 | 29,166.7 | 16 | 900 |
| 1 | 34 | 29,618,700,000 | 2,106,300,000 | 2,106,329,166.7 | 29,166.7 | 8 | 899 |
| 1 | 35 | 29,622,212,500 | 2,102,787,500 | 2,102,816,666.7 | 29,166.7 | 16 | 897 |

TABLE 7

Tuning Commands for Class B - Band 2

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 2 | 1 | 29,627,787,500 | 2,097,212,500 | 2,097,255,208.3 | 42,708.3 | 10 | 895 |
| 2 | 2 | 29,631,300,000 | 2,093,700,000 | 2,093,742,708.3 | 42,708.3 | 2 | 894 |
| 2 | 3 | 29,634,812,500 | 2,090,187,500 | 2,090,230,208.3 | 42,708.3 | 10 | 892 |
| 2 | 4 | 29,638,325,000 | 2,086,675,000 | 2,086,717,708.3 | 42,708.3 | 2 | 891 |
| 2 | 5 | 29,641,837,500 | 2,083,162,500 | 2,083,205,208.3 | 42,708.3 | 10 | 889 |
| 2 | 6 | 29,645,350,000 | 2,079,650,000 | 2,079,692,708.3 | 42,708.3 | 2 | 888 |
| 2 | 7 | 29,648,862,500 | 2,076,137,500 | 2,076,180,208.3 | 42,708.3 | 10 | 886 |
| 2 | 8 | 29,652,375,000 | 2,072,625,000 | 2,072,667,708.3 | 42,708.3 | 2 | 885 |
| 2 | 9 | 29,655,887,500 | 2,069,112,500 | 2,069,155,208.3 | 42,708.3 | 10 | 883 |
| 2 | 10 | 29,659,400,000 | 2,065,600,000 | 2,065,642,708.3 | 42,708.3 | 2 | 882 |
| 2 | 11 | 29,662,912,500 | 2,062,087,500 | 2,062,130,208.3 | 42,708.3 | 10 | 880 |
| 2 | 12 | 29,666,425,000 | 2,058,575,000 | 2,058,617,708.3 | 42,708.3 | 2 | 879 |
| 2 | 13 | 29,669,937,500 | 2,055,062,500 | 2,055,105,208.3 | 42,708.3 | 10 | 877 |
| 2 | 14 | 29,673,450,000 | 2,051,550,000 | 2,051,592,708.3 | 42,708.3 | 2 | 876 |
| 2 | 15 | 29,676,962,500 | 2,048,037,500 | 2,048,080,208.3 | 42,708.3 | 10 | 874 |
| 2 | 16 | 29,680,475,000 | 2,044,525,000 | 2,044,567,708.3 | 42,708.3 | 2 | 873 |
| 2 | 17 | 29,683,987,500 | 2,041,012,500 | 2,041,055,208.3 | 42,708.3 | 10 | 871 |
| 2 | 18 | 29,687,500,000 | 2,037,500,000 | 2,037,542,708.3 | 42,708.3 | 2 | 870 |
| 2 | 19 | 29,691,012,500 | 2,033,987,500 | 2,034,030,208.3 | 42,708.3 | 10 | 868 |
| 2 | 20 | 29,694,525,000 | 2,030,475,000 | 2,030,517,708.3 | 42,708.3 | 2 | 867 |
| 2 | 21 | 29,698,037,500 | 2,026,962,500 | 2,027,005,208.3 | 42,708.3 | 10 | 865 |
| 2 | 22 | 29,701,550,000 | 2,023,450,000 | 2,023,492,708.3 | 42,708.3 | 2 | 864 |
| 2 | 23 | 29,705,062,500 | 2,019,937,500 | 2,019,980,208.3 | 42,708.3 | 10 | 862 |
| 2 | 24 | 29,708,575,000 | 2,016,425,000 | 2,016,467,708.3 | 42,708.3 | 2 | 861 |
| 2 | 25 | 29,712,087,500 | 2,012,912,500 | 2,012,955,208.3 | 42,708.3 | 10 | 859 |
| 2 | 26 | 29,715,600,000 | 2,009,400,000 | 2,009,442,708.3 | 42,708.3 | 2 | 858 |
| 2 | 27 | 29,719,112,500 | 2,005,887,500 | 2,005,930,208.3 | 42,708.3 | 10 | 856 |
| 2 | 28 | 29,722,625,000 | 2,002,375,000 | 2,002,417,708.3 | 42,708.3 | 2 | 855 |
| 2 | 29 | 29,726,137,500 | 1,998,862,500 | 1,998,905,208.3 | 42,708.3 | 10 | 853 |
| 2 | 30 | 29,729,650,000 | 1,995,350,000 | 1,995,392,708.3 | 42,708.3 | 2 | 852 |
| 2 | 31 | 29,733,162,500 | 1,991,837,500 | 1,991,880,208.3 | 42,708.3 | 10 | 850 |
| 2 | 32 | 29,736,675,000 | 1,988,325,000 | 1,988,367,708.3 | 42,708.3 | 2 | 849 |
| 2 | 33 | 29,740,187,500 | 1,984,812,500 | 1,984,855,208.3 | 42,708.3 | 10 | 2847 |
| 2 | 34 | 29,743,700,000 | 1,981,300,000 | 1,981,342,708.3 | 42,708.3 | 2 | 846 |
| 2 | 35 | 29,747,212,500 | 1,977,787,500 | 1,977,830,208.3 | 42,708.3 | 10 | 844 |

TABLE 8

Tuning Commands for Class B - Band 3

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 3 | 1 | 29,752,787,500 | 1,972,212,500 | 1,972,268,750.0 | 56,250.0 | 4 | 842 |
| 3 | 2 | 29,756,300,000 | 1,968,700,000 | 1,968,756,250.0 | 56,250.0 | 12 | 840 |
| 3 | 3 | 29,759,812,500 | 1,965,187,500 | 1,965,243,750.0 | 56,250.0 | 4 | 839 |
| 3 | 4 | 29,763,325,000 | 1,961,675,000 | 1,961,731,250.0 | 56,250.0 | 12 | 837 |
| 3 | 5 | 29,766,837,500 | 1,958,162,500 | 1,958,218,750.0 | 56,250.0 | 4 | 836 |
| 3 | 6 | 29,770,350,000 | 1,954,650,000 | 1,954,706,250.0 | 56,250.0 | 12 | 834 |
| 3 | 7 | 29,773,862,500 | 1,951,137,500 | 1,951,193,750.0 | 56,250.0 | 4 | 833 |
| 3 | 8 | 29,777,375,000 | 1,947,625,000 | 1,947,681,250.0 | 56,250.0 | 12 | 831 |
| 3 | 9 | 29,780,887,500 | 1,944,112,500 | 1,944,168,750.0 | 56,250.0 | 4 | 830 |
| 3 | 10 | 29,784,400,000 | 1,940,600,000 | 1,940,656,250.0 | 56,250.0 | 12 | 288 |
| 3 | 11 | 29,787,912,500 | 1,937,087,500 | 1,937,143,750.0 | 56,250.0 | 4 | 827 |
| 3 | 12 | 29,791,425,000 | 1,933,575,000 | 1,933,631,250.0 | 56,250.0 | 12 | 825 |
| 3 | 13 | 29,794,937,500 | 1,930,062,500 | 1,930,118,750.0 | 56,250.0 | 4 | 824 |
| 3 | 14 | 29,798,450,000 | 1,926,550,000 | 1,926,606,250.0 | 56,250.0 | 12 | 822 |
| 3 | 15 | 29,801,962,500 | 1,923,037,500 | 1,923,093,750.0 | 56,250.0 | 4 | 821 |
| 3 | 16 | 29,805,475,000 | 1,919,525,000 | 1,919,581,250.0 | 56,250.0 | 12 | 819 |
| 3 | 17 | 29,808,987,500 | 1,916,012,500 | 1,916,068,750.0 | 56,250.0 | 4 | 818 |
| 3 | 18 | 29,812,500,000 | 1,912,500,000 | 1,912,556,250.0 | 56,250.0 | 12 | 816 |
| 3 | 19 | 29,816,012,500 | 1,908,987,500 | 1,909,043,750.0 | 56,250.0 | 4 | 815 |
| 3 | 20 | 29,819,525,000 | 1,905,475,000 | 1,905,531,250.0 | 56,250.0 | 12 | 813 |
| 3 | 21 | 29,823,037,500 | 1,901,962,500 | 1,902,018,750.0 | 56,250.0 | 4 | 812 |
| 3 | 22 | 29,826,550,000 | 1,898,450,000 | 1,898,506,250.0 | 56,250.0 | 12 | 810 |
| 3 | 23 | 29,830,062,500 | 1,894,937,500 | 1,894,993,750.0 | 56,250.0 | 4 | 809 |
| 3 | 24 | 29,833,575,000 | 1,891,425,000 | 1,891,481,250.0 | 56,250.0 | 12 | 807 |
| 3 | 25 | 29,837,087,500 | 1,887,912,500 | 1,887,968,750.0 | 56,250.0 | 4 | 806 |
| 3 | 26 | 29,840,600,000 | 1,884,400,000 | 1,884,456,250.0 | 56,250.0 | 12 | 804 |
| 3 | 27 | 29,844,112,500 | 1,880,887,500 | 1,880,943,750.0 | 56,250.0 | 4 | 803 |
| 3 | 28 | 29,847,625,000 | 1,877,375,000 | 1,877,431,250.0 | 56,250.0 | 12 | 801 |
| 3 | 29 | 29,851,137,500 | 1,873,862,500 | 1,873,918,750.0 | 56,250.0 | 4 | 800 |
| 3 | 30 | 29,854,650,000 | 1,870,350,000 | 1,870,406,250.0 | 56,250.0 | 12 | 798 |
| 3 | 31 | 29,858,162,500 | 1,866,837,500 | 1,866,893,750.0 | 56,250.0 | 4 | 797 |
| 3 | 32 | 29,861,675,000 | 1,863,325,000 | 1,863,381,250.0 | 56,250.0 | 12 | 795 |
| 3 | 33 | 29,865,187,500 | 1,859,812,500 | 1,859,868,750.0 | 56,250.0 | 4 | 794 |
| 3 | 34 | 29,868,700,000 | 1,856,300,000 | 1,856,356,250.0 | 56,250.0 | 12 | 792 |
| 3 | 35 | 29,872,212,500 | 1,852,787,500 | 1,852,843,750.0 | 56,250.0 | 4 | 791 |

TABLE 9

Tuning Commands for Class B - Band 4

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 4 | 1 | 29,877,787,500 | 1,847,212,500 | 1,847,282,291.7 | 69,791.7 | 14 | 788 |
| 4 | 2 | 29,881,300,000 | 1,843,700,000 | 1,843,769,791.7 | 69,791.7 | 6 | 787 |
| 4 | 3 | 29,884,812,500 | 1,840,187,500 | 1,840,257,291.7 | 69,791.7 | 14 | 785 |
| 4 | 4 | 29,888,325,000 | 1,836,675,000 | 1,836,744,791.7 | 69,791.7 | 6 | 784 |
| 4 | 5 | 29,891,837,500 | 1,833,162,500 | 1,833,232,291.7 | 69,791.7 | 14 | 782 |
| 4 | 6 | 29,895,350,000 | 1,829,650,000 | 1,829,719,791.7 | 69,791.7 | 6 | 781 |
| 4 | 7 | 29,898,862,500 | 1,826,137,500 | 1,826,207,291.7 | 69,791.7 | 14 | 779 |
| 4 | 8 | 29,902,375,000 | 1,822,625,000 | 1,822,694,791.7 | 69,791.7 | 6 | 778 |
| 4 | 9 | 29,905,887,500 | 1,819,112,500 | 1,819,182,291.7 | 69,791.7 | 14 | 776 |
| 4 | 10 | 29,909,400,000 | 1,815,600,000 | 1,815,669,791.7 | 69,791.7 | 6 | 775 |
| 4 | 11 | 29,912,912,500 | 1,812,087,500 | 1,812,157,291.7 | 69,791.7 | 14 | 773 |
| 4 | 12 | 29,916,425,000 | 1,808,575,000 | 1,808,644,791.7 | 69,791.7 | 6 | 772 |
| 4 | 13 | 29,919,937,500 | 1,805,062,500 | 1,805,132,291.7 | 69,791.7 | 14 | 770 |
| 4 | 14 | 29,923,450,000 | 1,801,550,000 | 1,801,619,791.7 | 69,791.7 | 6 | 769 |
| 4 | 15 | 29,926,962,500 | 1,798,037,500 | 1,798,107,291.7 | 69,791.7 | 14 | 767 |
| 4 | 16 | 29,930,475,000 | 1,794,525,000 | 1,794,594,791.7 | 69,791.7 | 6 | 766 |
| 4 | 17 | 29,933,987,500 | 1,791,012,500 | 1,791,082,291.7 | 69,791.7 | 14 | 764 |
| 4 | 18 | 29,937,500,000 | 1,787,500,000 | 1,787,569,791.7 | 69,791.7 | 6 | 763 |
| 4 | 19 | 29,941,012,500 | 1,783,987,500 | 1,784,057,291.7 | 69,791.7 | 14 | 761 |
| 4 | 20 | 29,944,525,000 | 1,780,475,000 | 1,780,544,791.7 | 69,791.7 | 6 | 760 |
| 4 | 21 | 29,948,037,500 | 1,776,962,500 | 1,777,032,291.7 | 69,791.7 | 14 | 758 |
| 4 | 22 | 29,951,550,000 | 1,773,450,000 | 1,773,519,791.7 | 69,791.7 | 6 | 757 |
| 4 | 23 | 29,955,062,500 | 1,769,937,500 | 1,770,007,291.7 | 69,791.7 | 14 | 755 |
| 4 | 24 | 29,958,575,000 | 1,766,425,000 | 1,766,494,791.7 | 69,791.7 | 6 | 754 |

TABLE 9-continued

Tuning Commands for Class B - Band 4

| Transmit Channel Band | Transmit Channel Number | Channel Center Frequency (Hz) | $f_{IF}$ (Hz) | $f_{VCO,IF}$ (Hz) | Offset Frequency (Hz) | F | N |
|---|---|---|---|---|---|---|---|
| 4 | 25 | 29,962,087,500 | 1,762,912,500 | 1,762,982,291.7 | 69,791.7 | 14 | 752 |
| 4 | 26 | 29,965,600,000 | 1,759,400,000 | 1,759,469,791.7 | 69,791.7 | 6 | 751 |
| 4 | 27 | 29,969,112,500 | 1,755,887,500 | 1,755,957,291.7 | 69,791.7 | 14 | 749 |
| 4 | 28 | 29,972,625,000 | 1,752,375,000 | 1,752,444,791.7 | 69,791.7 | 6 | 748 |
| 4 | 29 | 29,976,137,500 | 1,748,862,500 | 1,748,932,291.7 | 69,791.7 | 14 | 746 |
| 4 | 30 | 29,979,650,000 | 1,745,350,000 | 1,745,419,791.7 | 69,791.7 | 6 | 745 |
| 4 | 31 | 29,983,162,500 | 1,741,837,500 | 1,741,907,291.7 | 69,791.7 | 14 | 743 |
| 4 | 32 | 29,986,675,000 | 1,738,325,000 | 1,738,394,791.7 | 69,791.7 | 6 | 742 |
| 4 | 33 | 29,990,187,500 | 1,734,812,500 | 1,734,882,291.7 | 69,791.7 | 14 | 740 |
| 4 | 34 | 29,993,700,000 | 1,731,300,000 | 1,731,369,791.7 | 69,791.7 | 6 | 739 |
| 4 | 35 | 29,997,212,500 | 1,727,787,500 | 1,727,857,291.7 | 69,791.7 | 14 | 737 |

As can been seen in the tables above, the maximum offset frequency from the NCO (300) in either class A or class B systems is less than 70 kHz which is much smaller than either of the 702.5 kHz or 3.5125 MHz channel bandwidths for class A or class B, respectively. These offsets differ for each band (500*a*–*d*; FIG. 5), but are fixed within a given band (e.g., 500*a*; FIG. 5).

After producing the frequency offset that is needed for a desired frequency step size, the NCO (300) will change the frequency offset slightly to compensate for the Doppler effect in each band (500*a*–*d*; FIG. 5).

Finally, the components labeled as (306) in FIG. 3 are part of the IDU (100). A detailed description of their functionality will not be given. They may or may not be needed in two-way satellite communication systems. As can be seen in FIG. 3 as well, a phase lock loop (PLL) (307) generates the reference frequency, $f_{REF}$, that is used by the components of the ODU (106).

The preceding description has been presented only to illustrate and describe the invention. It is not intended to be exhaustive or to limit the invention to any precise form disclosed. Many modifications and variations are possible in light of the above teaching.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A modulation system for modulating data onto a carrier signal in a plurality of channels, each of said channels having a channel bandwidth, said system comprising:

a digital modulator outputting a modulated baseband signal;

an intermediate frequency modulator that receives said modulated baseband signal and outputs an intermediate frequency signal derived from said modulated baseband signal;

a frequency synthesizing system outputting a synthesized intermediate frequency signal to said intermediate frequency modulator; and a circuit connected to said digital modulator, said circuit providing a signal to said digital modulator, said signal having a frequency including an offset that allows said frequency synthesizing system and intermediate frequency modulator to make frequency steps equal to said channel bandwidth, wherein said circuit comprises a numerically controlled oscillator and said numerically controlled oscillator receives a data signal, said offset being based on said data signal.

2. The system of claim 1, wherein said modulation system is incorporated in a two-way satellite communication system and said data signal is received from a satellite.

3. The system of claim 1, wherein said frequency synthesizing system is comprised of two frequency synthesizers.

4. The system of claim 3, wherein said frequency synthesizers are configured in a ping-pong configuration, said frequency synthesizing system further comprising a switch connected between said two frequency synthesizers and said intermediate frequency modulator, said switch selectively connecting said intermediate frequency modulator with one of said frequency synthesizers.

5. The system of claim 1, wherein each of said frequency synthesizing system comprises a programmable circuit for controlling a frequency output of said frequency synthesizing system.

6. The system of claim 1, wherein said frequency synthesizing system comprises a bank of filters for filtering spurious noise of said synthesized intermediate frequency signal.

7. The system of claim 1, wherein said circuit connected to said digital modulator further provides said signal to said digital modulator, said signal having a frequency including an additional offset that compensates for Doppler effect in transmission of said carrier signal.

8. A modulation system for modulating data onto a carrier signal in a plurality of channels, each of said channels having a channel bandwidth, said system comprising:

a digital modulator outputting a modulated baseband signal;

an intermediate frequency modulator that receives said modulated baseband signal and outputs an intermediate frequency signal derived from said modulated baseband signal;

a frequency synthesizing system outputting a synthesized intermediate frequency signal to said intermediate frequency modulator; and a circuit connected to said digital modulator, said circuit providing a signal to said digital modulator, said signal having a frequency including an offset that compensates for Doppler effect in transmission of said carrier signal,
  wherein said circuit comprises a numerically controlled oscillator and said numerically controlled oscillator receives a data signal, said offset being based on said data signal.

9. The system of claim 8, wherein said modulation system is incorporated in a two-way satellite communication system and said data signal is received from a satellite.

10. The system of claim 8, wherein said frequency synthesizing system is comprised of two frequency synthesizers.

11. The system of claim 10, wherein said frequency synthesizers are configured in a ping-pong configuration, said frequency synthesizing system further comprising a switch connected between said two frequency synthesizers and said intermediate frequency modulator, said switch selectively connecting said intermediate frequency modulator with one of said frequency synthesizers.

12. The system of claim 8, wherein each of said frequency synthesizing system comprises a programmable circuit for controlling a frequency output of said frequency synthesizing system.

13. The system of claim 8, wherein said frequency synthesizing system comprises a bank of filters for filtering spurious noise of said synthesized intermediate frequency signal.

14. The system of claim 8, wherein said circuit connected to said digital modulator further provides said signal to said intermediate frequency modulator, said signal having a frequency including an additional offset that allows said frequency synthesizing system and intermediate frequency modulator to make frequency steps equal to said channel bandwidth.

15. A method for modulating data onto a carrier signal in a plurality of channels, each of said channels having a channel bandwidth, said method comprising:
  providing a signal to a digital modulator that modulates a baseband signal, said signal having a frequency including an offset that allows a frequency synthesizing system and intermediate frequency modulator to make frequency steps equal to said channel bandwidth;
  generating said signal including said offset with a numerically controlled oscillator; and
  inputting a data signal to said numerically controlled oscillator, wherein said numerically controlled oscillator generates said offset based on said data signal.

16. The method of claim 15, further comprising receiving said data signal from a satellite in a two-way satellite communication system.

17. The method of claim 15, wherein said frequency synthesizing system comprises a programmable circuit for controlling a frequency output of said frequency synthesizing system, said method further comprising programming said programmable circuit.

18. The method of claim 15, further comprising generating said signal with a frequency including an additional offset that compensates for Doppler effect in transmission of said carrier signal.

19. A method of modulating data onto a carrier signal in a plurality of channels, each of said channels having a channel bandwidth, said method comprising:
  providing a signal to a digital modulator that modulates a baseband signal, said signal having a frequency including an offset that compensates for Doppler effect in transmission of said carrier signal;
  generating said signal including said offset with a numerically controlled oscillator; and
  inputting a data signal to said numerically controlled oscillator, wherein said numerically controlled oscillator generates said offset based on said data signal.

20. The method of claim 19, further comprising receiving said data signal from a satellite in a two-way satellite communication system.

21. The method of claim 19, further comprising generating said signal with a frequency including an additional offset that allows a frequency synthesizing system and intermediate frequency modulator to make frequency steps equal to said channel bandwidth.

22. A system for modulating data onto a carrier signal in a plurality of channels, each of said channels having a channel bandwidth, said system comprising:
  a digital modulator outputting a modulated baseband signal;
  an intermediate frequency modulator that receives said modulated baseband signal and outputs an intermediate frequency signal derived from said modulated baseband signal;
  a frequency synthesizing system outputting a synthesized intermediate frequency signal to said intermediate frequency modulator; and
  means for generating a signal input to said digital modulator, said signal having a frequency including an offset that allows said frequency synthesizing system and said intermediate frequency modulator to make frequency steps equal to said channel bandwidth, said means for generating said signal including a numerically controlled oscillator; and
  means for inputting a data signal to said numerically controlled oscillator,
  wherein said numerically controlled oscillator generates said offset based on said data signal.

23. The system of claim 22, further comprising means for receiving said data signal from a satellite in a two-way satellite communication system.

24. The system of claim 22, wherein said frequency synthesizing system comprises programmable means for controlling a frequency output of said frequency synthesizing system.

25. The system of claim 22, further comprising means for generating said signal with a frequency including an additional offset that compensates for Doppler effect in transmission of said carrier signal.

26. A system for modulating data onto a carrier signal in a plurality of channels, each of said channels having a channel bandwidth, said system comprising:
  a digital modulator outputting a modulated baseband signal;
  an intermediate frequency modulator that receives said modulated baseband signal and outputs an intermediate frequency signal derived from said modulated baseband signal;
  a frequency synthesizing system outputting a synthesized intermediate frequency signal to said intermediate frequency modulator;
  means for generating a signal input to said digital modulator, said signal having a frequency including an offset that compensates for Doppler effect in transmission of said carrier signal, said means for generating said signal including a numerically controlled oscillator; and
  means for inputting a data signal to said numerically controlled oscillator,
  wherein said numerically controlled oscillator generates said offset based on said data signal.

27. The system of claim 26, further comprising means for receiving said data signal from a satellite in a two-way satellite communication system.

28. The system of claim 26, wherein said frequency synthesizing system comprises programmable means for controlling a frequency output of said frequency synthesizing system.

29. The system of claim 26, further comprising means for generating said signal with a frequency including an additional offset that allows said frequency synthesizing system and said intermediate frequency modulator to make frequency steps equal to said channel bandwidth.

* * * * *